(12) United States Patent
Kim

(10) Patent No.: US 11,716,911 B2
(45) Date of Patent: Aug. 1, 2023

(54) ELECTRONIC DEVICE

(71) Applicant: SK hynix Inc., Icheon (KR)

(72) Inventor: Hwang Yeon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/116,718

(22) Filed: Dec. 9, 2020

(65) Prior Publication Data

US 2021/0091308 A1    Mar. 25, 2021

Related U.S. Application Data

(63) Continuation of application No. 16/414,684, filed on May 16, 2019, now Pat. No. 10,892,412.

(30) Foreign Application Priority Data

Sep. 21, 2018   (KR) ........................ 10-2018-0114206

(51) Int. Cl.
  *H01L 45/00* (2006.01)
  *H01L 27/24* (2006.01)

(52) U.S. Cl.
  CPC ...... *H01L 45/1675* (2013.01); *H01L 27/2436* (2013.01); *H01L 27/2481* (2013.01); *H01L 45/1233* (2013.01); *H01L 45/1253* (2013.01); *H01L 45/1691* (2013.01); *H01L 45/06* (2013.01); *H01L 45/144* (2013.01); *H01L 45/147* (2013.01)

(58) Field of Classification Search
None
See application file for complete search history.

(56) References Cited

U.S. PATENT DOCUMENTS

| | | |
|---|---|---|
| 9,401,474 B2 | 7/2016 | Kim et al. |
| 10,050,194 B1 | 8/2018 | Nardi |
| 2001/0003062 A1 | 6/2001 | Tang |
| 2010/0213433 A1 | 8/2010 | Yamamoto |
| 2014/0217598 A1 | 8/2014 | Noda |
| 2015/0372061 A1 | 12/2015 | Lee |
| 2016/0351623 A1 | 12/2016 | Chen et al. |

(Continued)

FOREIGN PATENT DOCUMENTS

| | | |
|---|---|---|
| CN | 106816442 A | 6/2017 |
| JP | 2010-192800 A | 9/2010 |

(Continued)

*Primary Examiner* — Mounir S Amer

(57) ABSTRACT

A method of fabricating an electronic device including a semiconductor memory includes forming a first conductive structure extending in a first direction and having a closed-loop shape, forming a second conductive structure extending in a second direction and having a closed-loop shape, the second direction intersecting the first direction, forming a memory cell located at an intersection of the first conductive structure and the second conductive structure, forming first conductive patterns extending in the first direction by etching an end portion of the first conductive structure, forming second conductive patterns extending in the second direction by etching an end portion of the second conductive structure, forming a first protective layer on an etched surface of each of the first conductive patterns and the second conductive patterns, and forming a gap-fill layer on the first protective layer.

15 Claims, 24 Drawing Sheets

(56) References Cited

U.S. PATENT DOCUMENTS

2016/0358933 A1\* 12/2016 Rabkin ............. H01L 21/02192
2017/0123662 A1\* 5/2017 Sharon .................. G06F 3/0661
2017/0236746 A1\* 8/2017 Yu ..................... H01L 21/76805
  257/314

FOREIGN PATENT DOCUMENTS

| JP | 2011071380 A | 4/2011 |
|----|--------------|--------|
| KR | 20120120729 | 11/2012 |
| KR | 10-2017-0086347 A | 7/2017 |

\* cited by examiner

A-A'

B-B'

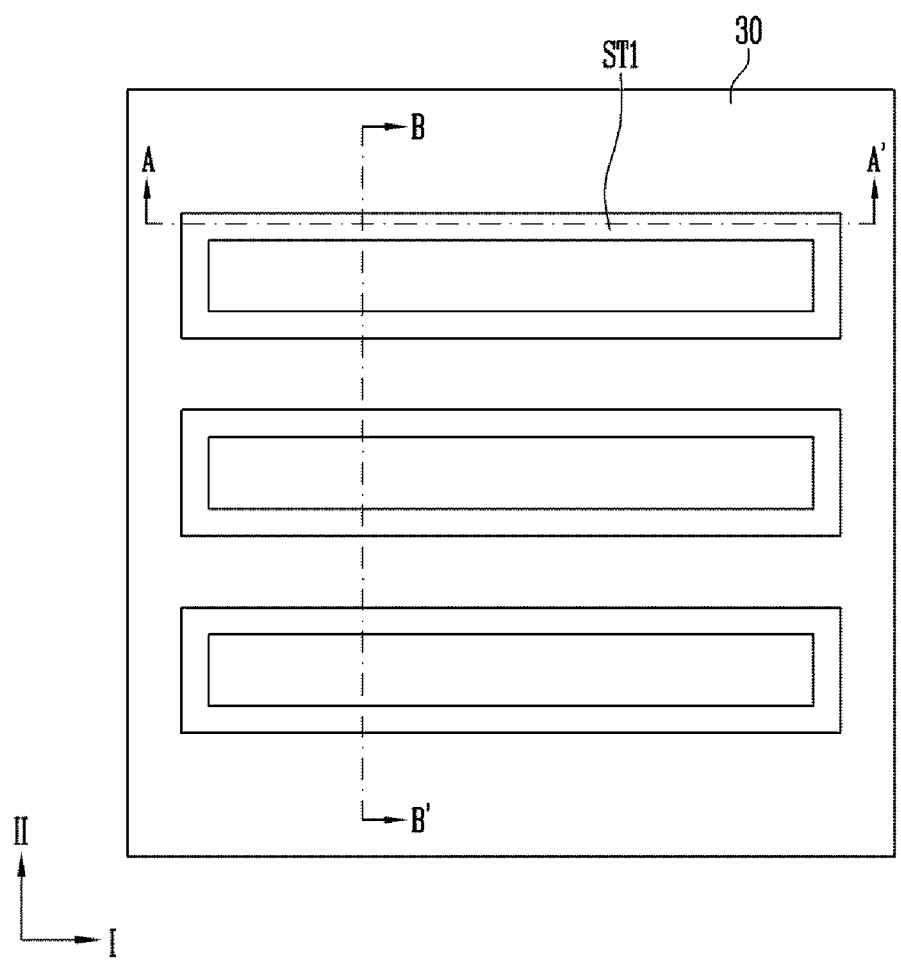

A-A'

B-B'

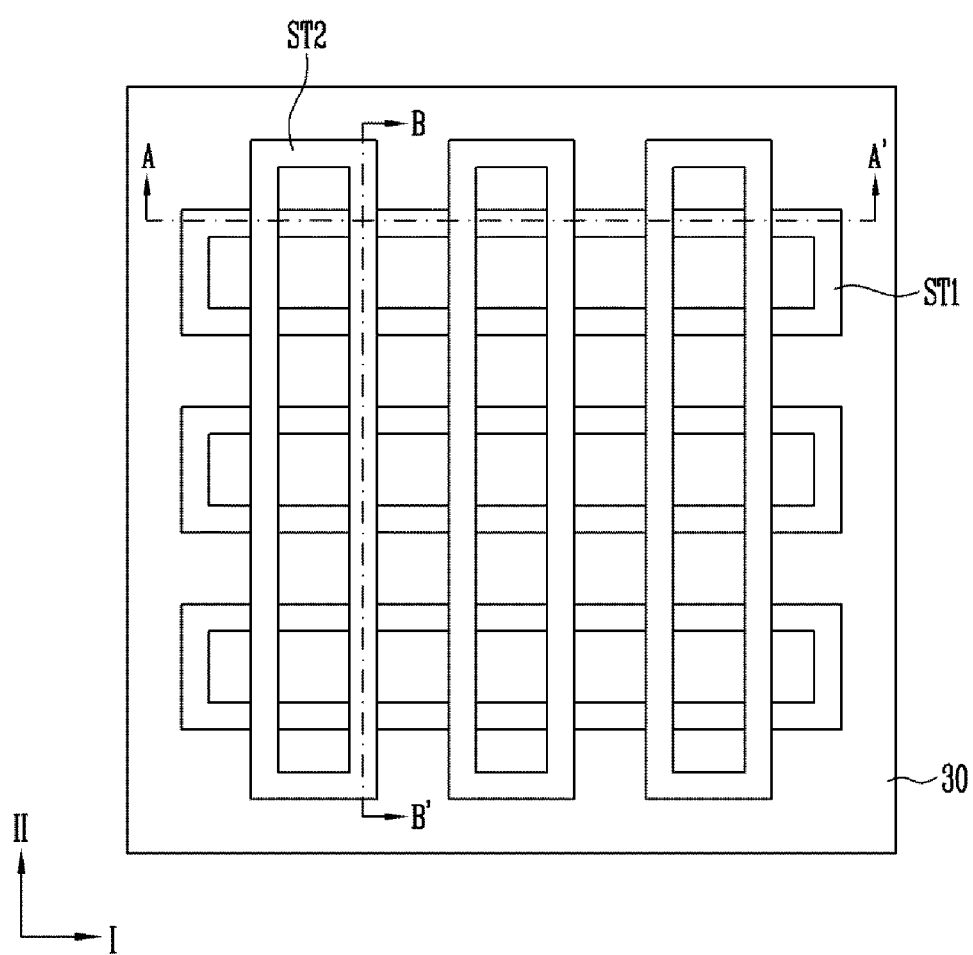

A-A'

B-B'

A-A'

B-B'

A-A'

B-B'

ELECTRONIC DEVICE

CROSS-REFERENCE TO RELATED APPLICATION

The present application is the continuation of U.S. patent application Ser. No. 16/414,684 filed May 16, 2019 and claims priority under 35 U.S.C. § 119(a) to Korean patent application number 10-2018-0114206, filed on Sep. 21, 2018, which is incorporated herein by reference in its entirety.

BACKGROUND

Field of Invention

Various embodiments of the present disclosure generally relate to a memory circuit or device, and an application thereof in an electronic device.

Description of Related Art

Recently, as electronic devices trend toward miniaturization, low power consumption, high performance, diversification, and so on, semiconductor devices capable of storing information in various electronic devices, such as computers and portable communication devices, have been in demand. Thus, research has been conducted for developing semiconductor devices having switching characteristics, i.e., devices capable of storing data by switching between different resistance states according to an applied voltage or current. Examples of semiconductor devices with switching characteristics include a Resistive Random Access Memory (RRAM), a Phase-change Random Access Memory (PRAM), a Ferroelectric Random Access Memory (FRAM), a Magnetic Random Access Memory (MRAM), an E-fuse, and the like.

SUMMARY

Various embodiments of the present disclosure provide an electronic device including a memory cell with improved operating characteristics and reliability, and a method for fabricating the same.

According to an embodiment, a method of fabricating an electronic device including a semiconductor memory may include forming a first conductive structure extending in a first direction and having a closed-loop shape, forming a second conductive structure extending in a second direction and having a closed-loop shape, the second direction intersecting the first direction, forming a memory cell located at an intersection of the first conductive structure and the second conductive structure, forming first conductive patterns extending in the first direction by etching an end portion of the first conductive structure, forming second conductive patterns extending in the second direction by etching an end portion of the second conductive structure, forming a first protective layer on an etched surface of each of the first conductive patterns and the second conductive patterns, and forming a gap-fill layer on the first protective layer.

According to an embodiment, a method of fabricating an electronic device including a semiconductor memory may include forming first stack structures extending in a first direction, forming a first gap-fill layer between the first stack structures, forming second stack structures extending in a second direction that intersects the first direction, forming a second gap-fill layer between the second stack structures, forming a first trench passing through the first and second gap-fill layers and exposing a sidewall of the first stack structures, forming a first protective layer in the first trench, and forming a third gap-fill layer in the first trench in which the first protective layer is formed.

According to an embodiment, an electronic device including a semiconductor memory, in which the semiconductor memory may include first conductive patterns extending in a first direction, second conductive patterns extending in a second direction that intersects the first direction, first gap-fill layers between the first conductive patterns, second gap-fill layers between the second conductive patters, a first trench passing through the second gap-fill layers and exposing sidewalls of the first conductive patterns that face each other in the first direction, a third gap-fill layer formed in the first trench, and a first protective layer formed in the first trench and interposed between the first conductive patterns and the third gap-fill layer.

BRIEF DESCRIPTION OF THE DRAWINGS

FIGS. 3A to 8A, 3B to 8B, 3C to 8C, and 11 are diagrams illustrating a method of fabricating an electronic device including a semiconductor memory according to an embodiment of the present disclosure;

DETAILED DESCRIPTION

Figure 1A:
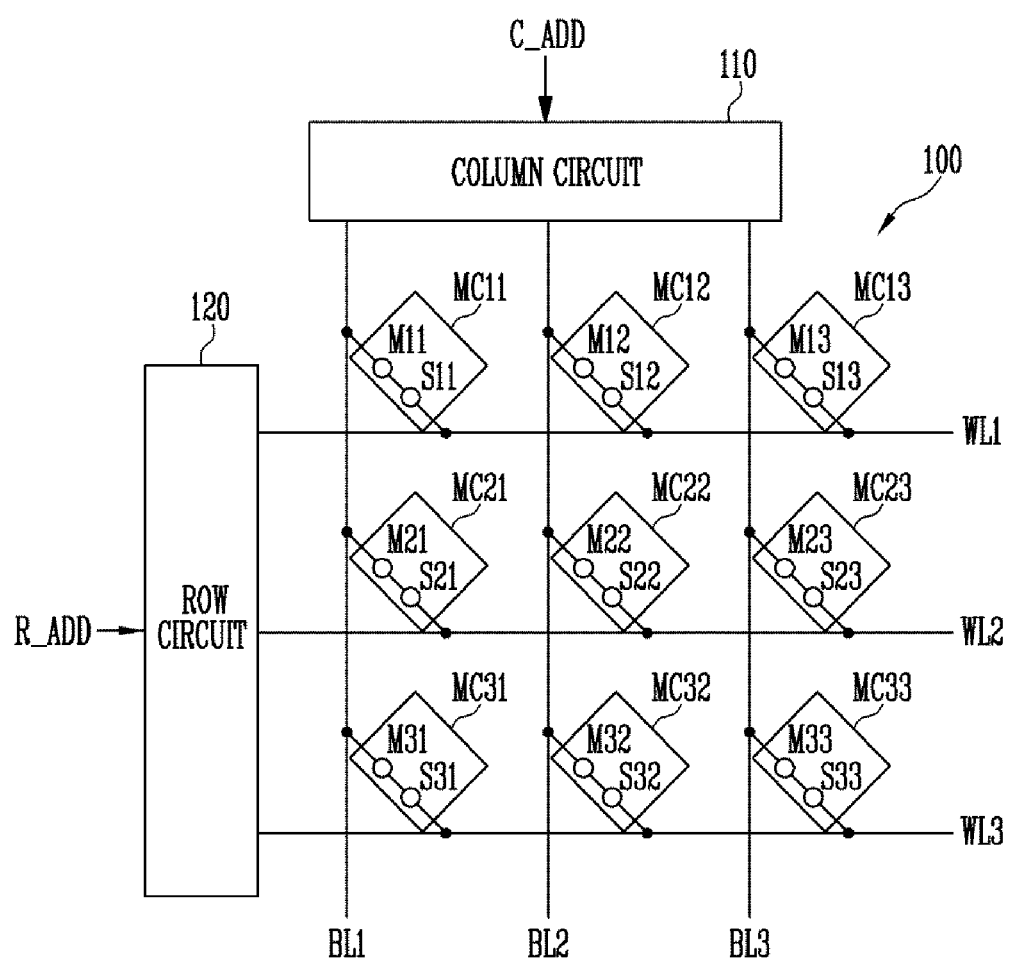
FIGS. 1A and 1B are diagrams illustrating the structure of an electronic device according to an embodiment of the present disclosure.

Hereinafter, various exemplary embodiments will be described in detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of various embodiments of the present disclosure to those skilled in the art. Throughout the disclosure, like reference numerals refer to like parts throughout the various figures and embodiments of the present disclosure.

The drawings are not necessarily to scale and, in some instances, proportions may have been exaggerated in order to clearly illustrate features of the embodiments. It will be understood that when an element is referred to as being "between" two elements, it can be the only element between the two elements, or one or more intervening elements may also be present. When a first layer is referred to as being "on" a second layer or "on" a substrate, it not only refers to a case where the first layer is formed directly on the second layer or the substrate but also a case where a third layer exists between the first layer and the second layer or the substrate. Like reference numerals refer to like elements throughout the disclosure.

Figure 1B:
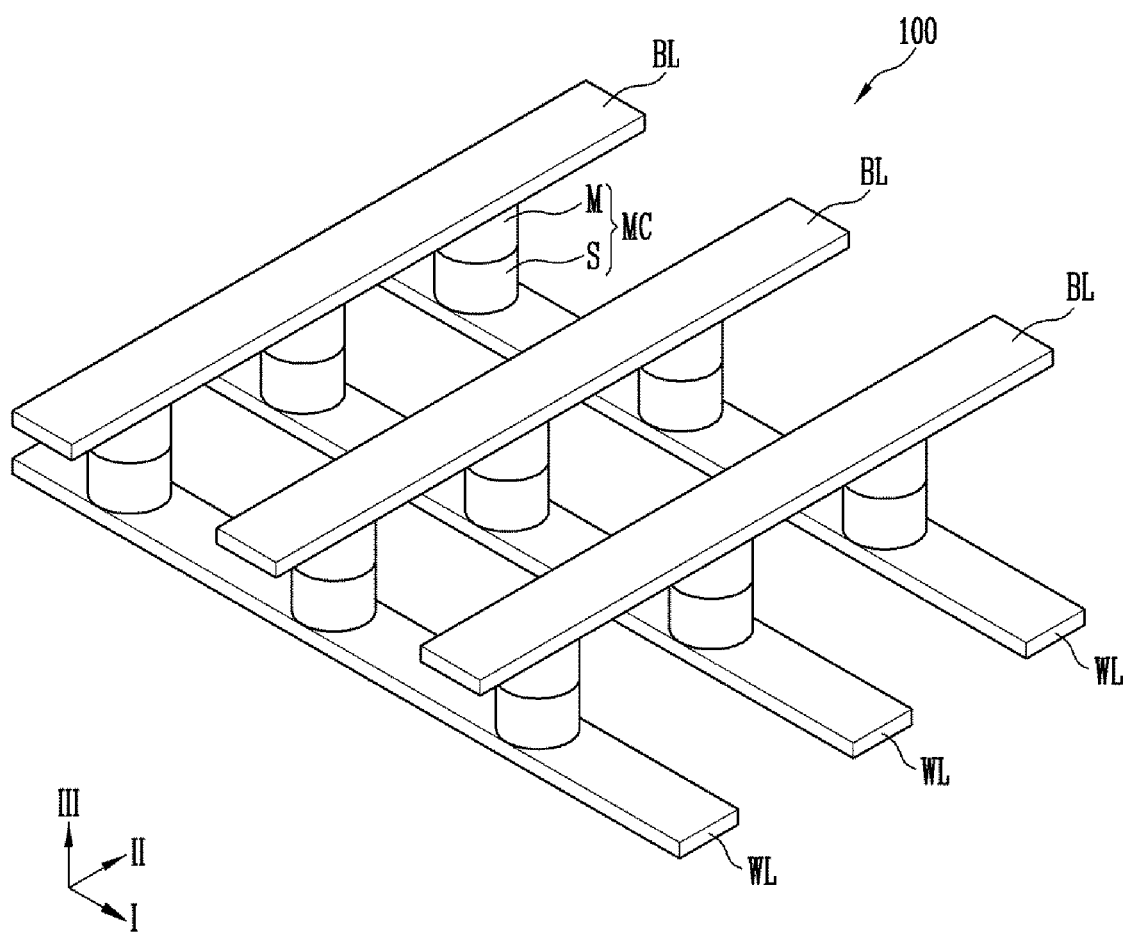

FIGS. 1A and 1B are diagrams illustrating the structure of an electronic device according to an embodiment of the present disclosure. FIG. 1A is a circuit diagram of a memory cell array 100, and FIG. 1B is a perspective view of a memory cell array corresponding to the memory cell array 100 of FIG. 1A.

Referring to FIG. 1A, the electronic device according to an embodiment of the present disclosure may include a semiconductor memory. The semiconductor memory may include row lines, and column lines intersecting the row lines. The row lines may be word lines and the column lines may be bit lines. The terms word lines and bit lines may be relative to each other. In other words, row lines may be the bit lines, and column lines may be the word lines. Hereinafter, in a specific example, row lines are word lines and column lines are bit lines.

The memory cell array 100 may include memory cells MC11 to MC33 respectively disposed between column lines BL1 to BL3 and row lines WL1 to WL3. The memory cells MC11 to MC33 may be disposed at respective intersections of the column lines BL1 to BL3 and the row lines WL1 to WL3. The memory cells MC11 to MC33 may include selection elements S11 to S33 and memory elements M11 to M33, respectively. The selection elements S11 to S33 and the memory elements M11 to M33 are coupled to each other in series, respectively. Each of the selection elements S11 to S33 may be electrically coupled to a corresponding one of the row lines WL1 to WL3. Each of the memory elements M11 to M33 may be electrically coupled to a corresponding one of the column lines BL1 to BL3.

Each of the memory elements M11 to M33 may include a memory pattern as a storage node for storing data. For example, the memory elements M11 to M33 may include a resistive material, a Magnetic Tunnel Junction (MTJ), or a variable resistance material such as a phase-change material. Each of the selection elements S11 to S33 may be configured to select the corresponding memory cell MC and include a switching material. The selection elements S11 to S33 may each include, for example, a diode, a PNP diode, a Bipolar Junction Transistor (BJT), a Metal Insulator Transition (MIT) element, a Mixed Ionic-Electronic Conducting (MIEC) element, an Ovonic Threshold Switching (OTS) element, or a combination thereof.

The shape and the configuration of each of the memory cells MC11 to MC33 may be variously changed according to various embodiments of the present disclosure. For example, the selection elements S11 to S33 may be omitted. In another example, positions of the selection elements S11 to S33 may be switched with positions of the memory elements M11 to M33. In other words, each of the selection elements S11 to S33 may be electrically coupled to a corresponding one of the column lines BL1 to BL3 and each of the memory elements M11 to M33 may be electrically coupled to a corresponding one of the row lines WL1 to WL3.

In addition, the semiconductor memory may further include a column circuit 110 configured to control the column lines BL1 to BL3, and a row circuit 120 configured to control the row lines WL1 to WL3.

The row circuit 120 may be a row decoder, a word line decoder, a word line driver, or a combination thereof. The row circuit 120 may select one of the row lines WL1 to WL3 based on a row address R_ADD. For example, the row circuit 120 may receive the row address R_ADD, and may select the row line WL2 among the row lines WL1 to WL3 based on the row address R_ADD. The column circuit 110 may be a column decoder, a bit line decoder, a bit line driver, or a combination thereof. The column circuit 110 may select one of the column lines BL1 to BL3 based on a column address C_ADD. For example, the column circuit 110 may receive the column address C_ADD, and may select the column line BL2 among the column lines BL1 to BL3 based on the column address C_ADD. One of the memory cells MC11 to MC33 is selected based on the selected one of the row lines WL1 to WL3 and the selected one of the column lines BL1 to BL3. For example, when the row circuit 120 selects the row line WL2 and the column circuit 110 selects the column line BL2, the memory cell MC22 coupled between the selected column line BL2 and the selected row line WL2 may be selected.

FIG. 1A illustrates an embodiment of the present disclosure where the three column lines BL1 to BL3 and the three row lines WL1 to WL3 are provided, but this is only for the sake of convenience of description. The present disclosure may not be limited thereto. The number of column lines or the number of row lines included in the memory cell array 100 may be changed as needed.

Referring to FIG. 1B, the memory cell array 100 may include column lines BL and row lines WL, which are located at different levels in a third direction III. For example, the column lines BL may be disposed above the row lines WL. The third direction III may cross a first direction I and a second direction II and be perpendicular to the first direction I and the second direction II.

The row lines WL may extend in parallel with each other in the first direction I, and the column lines BL may extend in parallel with each other in the second direction II intersecting the first direction I. The memory cells MC may be disposed at intersections of the column lines BL and the row lines WL and arranged in a matrix format. In addition, each of the memory cells MC may include a memory stack. For example, each of the memory cells MC may include a memory element M and a selection element S, which are stacked in the third direction III.

In addition, as illustrated in FIG. 1B, the memory cell array may have a single-deck structure. However, the present disclosure is not limited thereto. The memory cells MC may be stacked in the third direction III. For example, the memory cell array may have a multi-deck structure in which the row lines WL and the column lines BL are stacked alternately with each other in the third direction III. In the multi-deck structure, the memory cells may be located between the row lines WL and the column lines BL that are stacked alternately with each other.

According to the above-described structure, the memory cells MC may be arranged in a cross-point array structure, so that the integration density of the memory element may be improved. In addition, by stacking the memory cells MC in the multi-deck structure, the integration density of the memory element may be further improved.

Figure 2A:
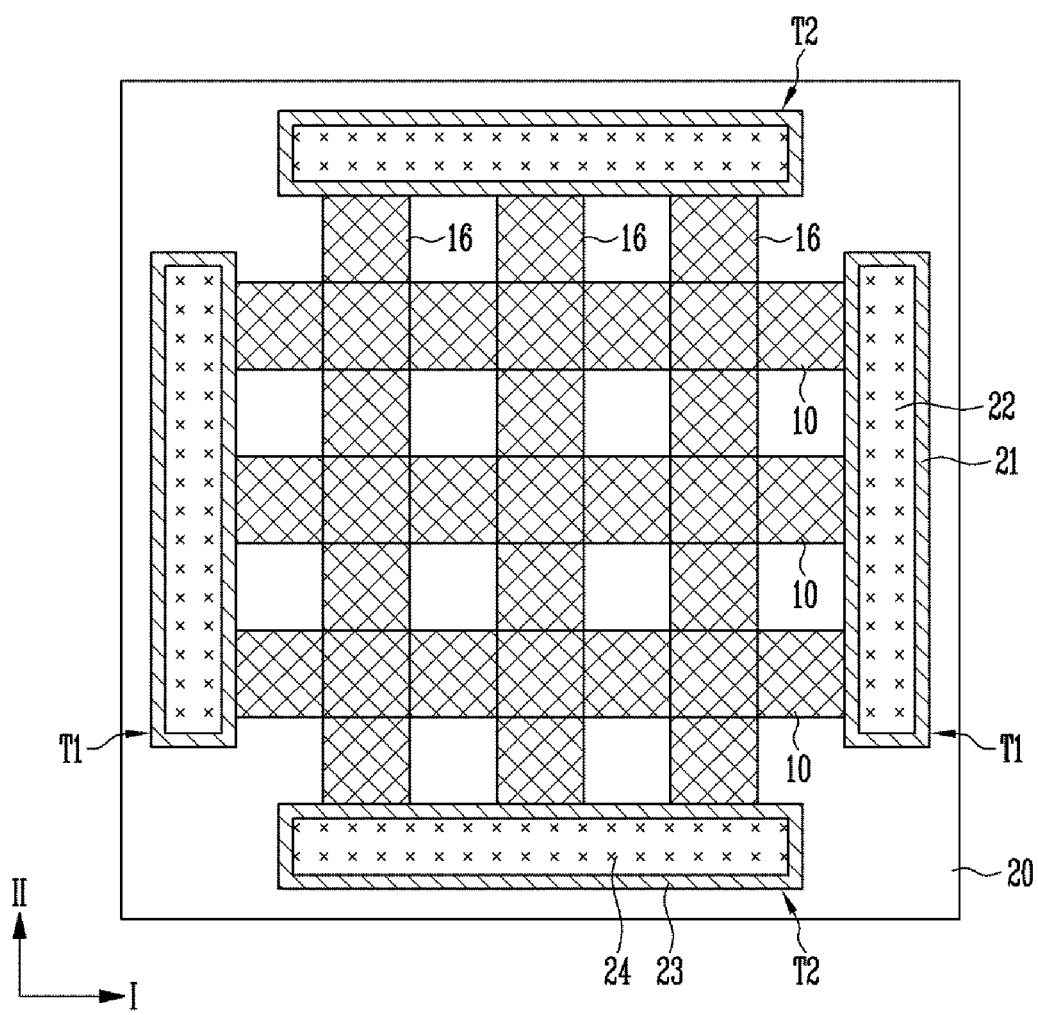
FIGS. 2A to 2C are diagrams illustrating the structure of an electronic device according to an embodiment of the present disclosure.
Figure 2B:
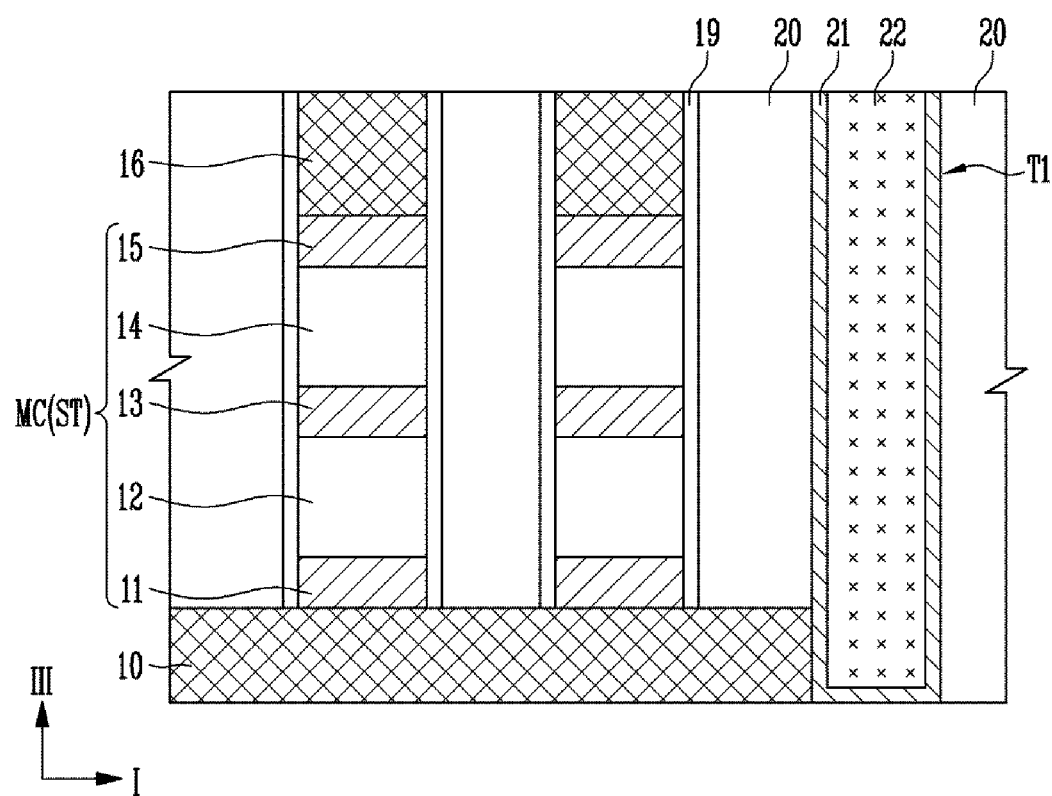
Figure 2C:
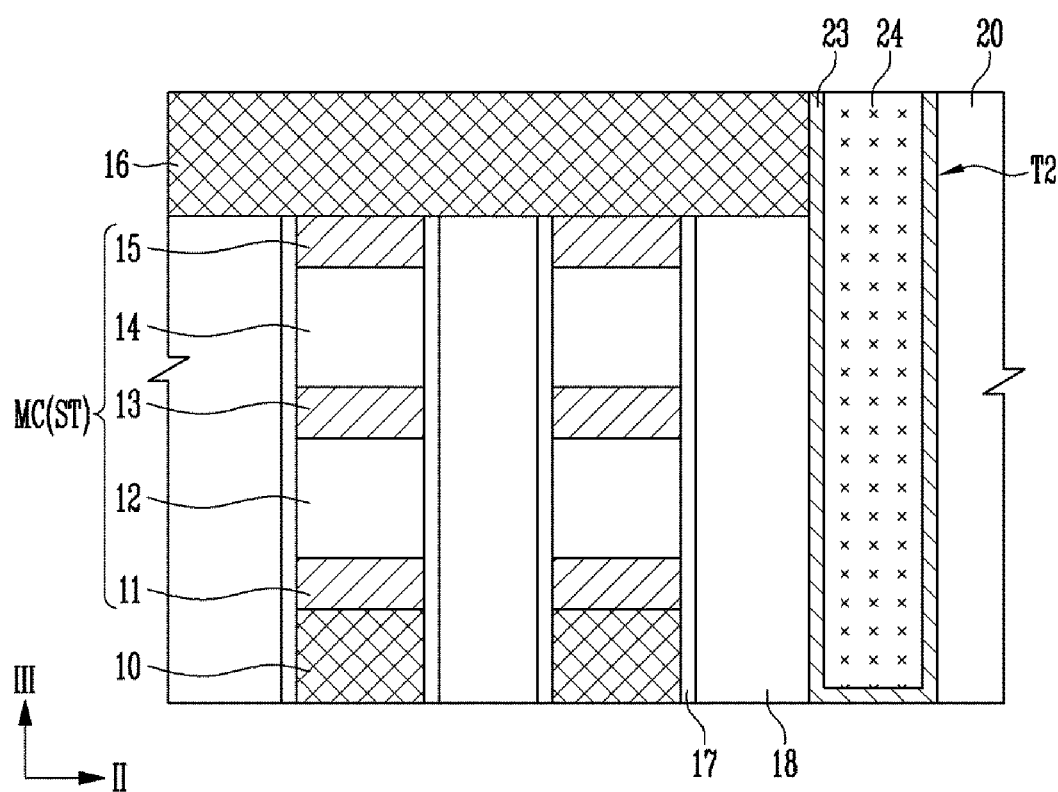

FIGS. 2A to 2C are diagrams illustrating the structure of an electronic device according to an embodiment of the present disclosure. FIG. 2A is a layout view, and illustrates a first direction I and a second direction II, FIG. 2B is a cross-sectional view of FIG. 2A taken along the first direction I, and FIG. 2C is a cross-sectional view of FIG. 2A taken along the second direction II.

Referring to FIGS. 2A to 2C, an electronic device according to an embodiment of the present disclosure may include a semiconductor memory. The semiconductor memory may include first conductive patterns extending in the first direction I and second conductive patterns extending in the second direction II. For example, the first conductive patterns may be row lines 10 and the second conductive patterns may be column lines 16. In another example, the first conductive patterns may be the column lines 16 and the second conductive patterns may be the row lines 10.

The row lines 10 and the column lines 16 may include a conductive material, such as polysilicon, and metal. For example, each of the row lines 10 and the column lines 16 may include tungsten (W), a tungsten nitride (WN), a tungsten silicide (WSi), titanium (Ti), a titanium nitride (TiN), a titanium silicon nitride (TiSiN), a titanium aluminum nitride (TiAlN), tantalum (Ta), a tantalum nitride (TaN), a tantalum silicon nitride (TaSiN), a tantalum aluminum nitride (TaAlN), carbon (C), a silicon carbide (SiC), a silicon carbon nitride (SiCN), copper (Cu), zinc (Zn), nickel (Ni), cobalt (Co), lead (Pd), platinum (Pt), or a combination thereof.

The semiconductor memory may further include the memory cells MC located at intersections of the row lines 10 and the column lines 16. Each of the memory cells MC may include a stack structure ST. The stack structure ST may include a lower electrode 11, a switching pattern 12, an intermediate electrode 13, a variable resistance pattern 14, and an upper electrode 15.

The variable resistance pattern 14 may reversibly switch between different resistance states depending on a voltage or current applied to the variable resistance pattern 14. For example, when the variable resistance pattern 14 has a low resistance state, data of '1' may be stored. On the other hand, when the variable resistance pattern 14 has a high resistance state, data of '0' may be stored.

When the variable resistance pattern 14 is a resistive material, the variable resistance pattern 14 may include a transition metal oxide, a metal oxide, such as a perovskite-based material, or a combination thereof. Therefore, data may be stored as an electrical path is generated or disappears in the variable resistance pattern 14.

When the variable resistance pattern 14 has an MTJ structure, the variable resistance pattern 14 may include a magnetization fixed layer, a magnetization free layer, and a tunnel barrier layer interposed therebetween. For example, the magnetization fixed layer and the magnetization free layer may include a magnetic material, and the tunnel barrier layer may include an oxide, such as an oxide of magnesium (Mg), aluminum (Al), zinc (Zn), or titanium (Ti). A magnetization direction of the magnetization free layer may be changed by spin torque of electrons in an applied current. Therefore, data may be stored depending on changes in magnetization direction of the magnetization free layer with respect to the magnetization direction of the magnetization fixed layer.

When the variable resistance pattern 14 is a phase-change material, the variable resistance pattern 14 may include a chalcogenide-based material. The variable resistance pattern 14 may include silicon (Si), germanium (Ge), antimony (Sb), tellurium (Te), bismuth (Bi), indium (In), tin (Sn), selenium (Se), or a combination thereof as the chalcogenide-based material. For example, the variable resistance pattern 14 may be Ge—Sb—Te(GST), such as, $Ge_2Sb_2Te_5$, $Ge_2Sb_2Te_7$, $Ge_1Sb_2Te_4$, or $Ge_1Sb_4Te_7$. A chemical composition ratio of the variable resistance pattern 14 may be determined depending on characteristics of a melting point, crystallization temperature, or the like. The variable resistance pattern 14 may further include an impurity such as carbon (C), or nitrogen (N). The phase-change material may have low resistance characteristics when in a crystalline state and high resistance characteristics when in an amorphous state. For example, data may be stored according to a set operation in which an amorphous state of high resistance is switched to a crystalline state of low resistance, or a reset operation in which a crystalline state of low resistance is switched into an amorphous state of high resistance.

The switching pattern 12 may be a selection element that controls a flow of a current according to a value of the applied voltage or current to the switching pattern 12. For example, when the value of the applied voltage or current is less than or equal to a predetermined critical value, the switching pattern 12 may substantially block a current through the switching pattern 12, and when the value of the applied voltage or current exceeds the predetermined critical value, the switching pattern 12 may pass the current through the switching pattern 12. When the value of the applied voltage or current exceeds the predetermined critical value, the current through the switching pattern 12 may sharply increase, which is substantially proportional to the value of the applied voltage or current.

When the switching pattern 12 is a Metal Insulator Transition (MIT) element, the switching pattern 12 may include $VO_2$, $NbO_2$, $TiO_2$, $WO_2$, $TiO_2$, or a combination thereof. When the switching pattern 12 is a Mixed Ionic-Electronic Conducting (MIEC) element, the switching pattern 12 may include $ZrO_2(Y_2O_3)$, $Bi_2O_3$—BaO, $(La_2O_3)x$ $(CeO_2)_{1-x}$, or a combination thereof. In addition, when the switching pattern 12 is an Ovonic Threshold Switching (OTS) element, the switching pattern 12 may include a chalcogenide-based material, such as $As_2Te_3$, $As_2$, $As_2Se_3$, or a combination thereof.

The lower electrode 11 may be electrically coupled to the row line 10, the intermediate electrode 13 may be interposed between the switching pattern 12 and the variable resistance pattern 14, and the upper electrode 15 may be electrically coupled to the column line 16. Each of the lower electrode 11, the intermediate electrode 13, and the upper electrode 15 may include a conductive material, such as metal or a metal nitride, or both. For example, each of the lower electrode 11, the intermediate electrode 13, and the upper electrode 15 may include tungsten (W), a tungsten nitride (WN), a tungsten silicide (WSi), titanium (Ti), a titanium nitride (TiN), a titanium silicon nitride (TiSiN), a titanium aluminum nitride (TiAlN), tantalum (Ta), a tantalum nitride (TaN), a tantalum silicon nitride (TaSiN), a tantalum aluminum nitride (TaAlN), carbon (C), a silicon carbide (SiC), a silicon carbon nitride (SiCN), copper (Cu), zinc (Zn), nickel (Ni), cobalt (Co), lead (Pd), platinum (Pt), or a combination thereof.

Each of the lower electrode 11, the intermediate electrode 13, and the upper electrode 15 may have a single-layer structure or a multi-layer structure. When each of the lower electrode 11, the intermediate electrode 13, and the upper electrode 15 has the multi-layer structure, an interface electrode contacting the variable resistance pattern 14 or the switching pattern 12 may be included. In addition, the lower electrode 11, the intermediate electrode 13, and the upper electrode 15 may have the same or different thicknesses. The shape and configuration of the stacked structure ST may be variously changed according to various embodiments of the present disclosure. For example, at least one of the lower electrode 11, the intermediate electrode 13, and the upper electrode 15 may be omitted.

In addition, to improve characteristics or processes of the memory cell MC, the interfaces between the layers 11 to 15 included in the stacked structure ST may be modified, or at least one layer may be added to the interfaces.

The semiconductor memory may further include a first liner layer 17 and a second liner layer 19. The first and second liner layers 17 and 19 may protect the stacked structures ST during fabricating processes, and may be formed on sidewalls of the stacked structures ST. The first liner layers 17 may surround the sidewalls of the stacked structures ST which face each other in the second direction II, and may extend in the first direction I. The second liner layers 19 may surround the sidewalls of the stacked structures ST which face each other in the first direction I, and may extend in the second direction II. The first and second liner layers 17 and 19 may include a nonconductive material, such as an oxide, a nitride, polysilicon, or a combination thereof. For example, each of the first and second liner layers 17 and 19 may include a silicon oxide ($SiO_x$), a silicon nitride ($Si_3N_4$), polysilicon, a titanium nitride (TiN), a tantalum nitride (TaN), or a combination thereof. In addition, each of the first and second liner layers 17 and 19 may include a single layer or multiple layers.

The semiconductor memory may further include a first gap-fill layer 18 and a second gap-fill layer 20. The first and second gap-fill layers 18 and 20 may fill spaces between each pair of the stack structures ST neighboring each other, spaces between the row lines 10, or spaces between the column lines 16. The first gap-fill layers 18 may fill spaces between each pair of the stack structures ST neighboring each other in the second direction II and spaces between the row lines 10. In addition, the second gap-fill layers 20 may fill spaces between each pair of the stack structures ST neighboring each other in the first direction I and spaces between the column lines 16. For example, each of the first and second gap-fill layers 18 and 20 may include an oxide such as a silicon oxide ($SiO_2$), or a flowable oxide layer, such as a Spin On Coating (SOC) layer, a Spin On Dielectric (SOD) layer, or a combination thereof.

The semiconductor memory may further include first trenches T1, which expose the first conductive patterns, for example, the row lines 10. Each of the first trenches T1 may have a depth to pass through the second gap-fill layer 20 and to expose a sidewall of each of the row lines 10. In addition, the first trenches T1 may expose end portions of the row lines 10, for example, sidewalls that face each other in the first direction I. Accordingly, the first trenches T1 may directly contact the end portions of the row lines 10 and directly expose the sidewalls of the end portions of each of the row lines 10.

A first protective layer 21 and a third gap-fill layer 22 may be formed in each of the first trenches T1. The first protective layer 21 may be formed along an inner surface of each of the first trenches T1, and the third gap-fill layer 22 may fill each of the first trenches T1. Accordingly, the first protective layer 21 may be interposed between each of the row lines 10 and the third gap-fill layer 22, and may separate each of the row lines 10 and the third gap-fill layer 22 from each other. The first protective layer 21 may include a material with low thermal conductivity, or a material which does not include oxygen atoms. For example, the first protective layer 21 may include a nitride, such as $Si_xN_y$, $Si_3N_4$, or a combination thereof. In addition, the third gap-fill layer 22 may include an oxide such as a silicon oxide $SiO_2$, or a flowable oxide layer, such as a Spin On Coating (SOC) layer, a Spin On Dielectric (SOD) layer, or a combination thereof.

The semiconductor memory may further include second trenches T2, which expose the second conductive patterns, for example, the column lines 16. Each of the second trenches T2 may have a depth to pass through the second gap-fill layer 20 and to expose a sidewall of each of the column lines 16. For example, the second trenches T2 may have substantially the same depth as the first trenches T1. In addition, the second trenches T2 may expose end portions of the column lines 16, for example, sidewalls that face each other in the second direction II. Accordingly, the second trenches T2 may directly contact the end portions of the column lines 16 and directly expose the sidewalls of the end portions of each of the column lines 16.

A second protective layer 23 and a fourth gap-fill layer 24 may be formed in each of the second trenches T2. The second protective layer 23 may be formed along an inner surface of each of the second trenches T2, and the fourth gap-fill layer 24 may fill each of the second trenches T2. Accordingly, the second protective layer 23 may be interposed between each of the column lines 16 and the fourth gap-fill layer 24, and may separate each of the column lines 16 and the fourth gap-fill layer 24 from each other. The second protective layer 23 may include a material with low thermal conductivity or a material which does not include oxygen atoms. For example, the second protective layer 23 may include a nitride, such as $Si_xN_y$, $Si_3N_4$, or a combination thereof. For example, the fourth gap-fill layer 24 may include an oxide such as a silicon oxide $SiO_2$, or a flowable oxide layer, such as a Spin On Coating (SOC) layer, a Spin On Dielectric (SOD) layer, or a combination thereof.

According to the above-described structure, the memory cells MC may be arranged in a cross-point array structure, so that the integration density of the memory element may be improved. In addition, the first and second protective layers 21 and 23 may prevent the sidewalls of the row lines 10 or the column lines 16 from deforming by forming the first and second protective layers 21 and 23 in the first and second trenches T1 and T2, respectively, in which the sidewalls of the row lines 10 or the column lines 16 are exposed, respectively.

FIGS. 3A to 8A, 3B to 8B, and 3C to 8C are diagrams illustrating a method of fabricating an electronic device including a semiconductor memory according to an embodiment of the present disclosure. FIGS. 3A to 8A are layout views, and illustrate the first direction I and the second direction II. FIGS. 3B to 8B are cross-sectional diagrams taken along line A-A' of FIGS. 3A to 8A, respectively. FIGS. 3C to 8C are cross-sectional diagrams taken along line B-B' of FIGS. 3A to 8A, respectively. Hereinafter, any repetitive detailed description of components already mentioned above will be omitted.

Figure 3A:
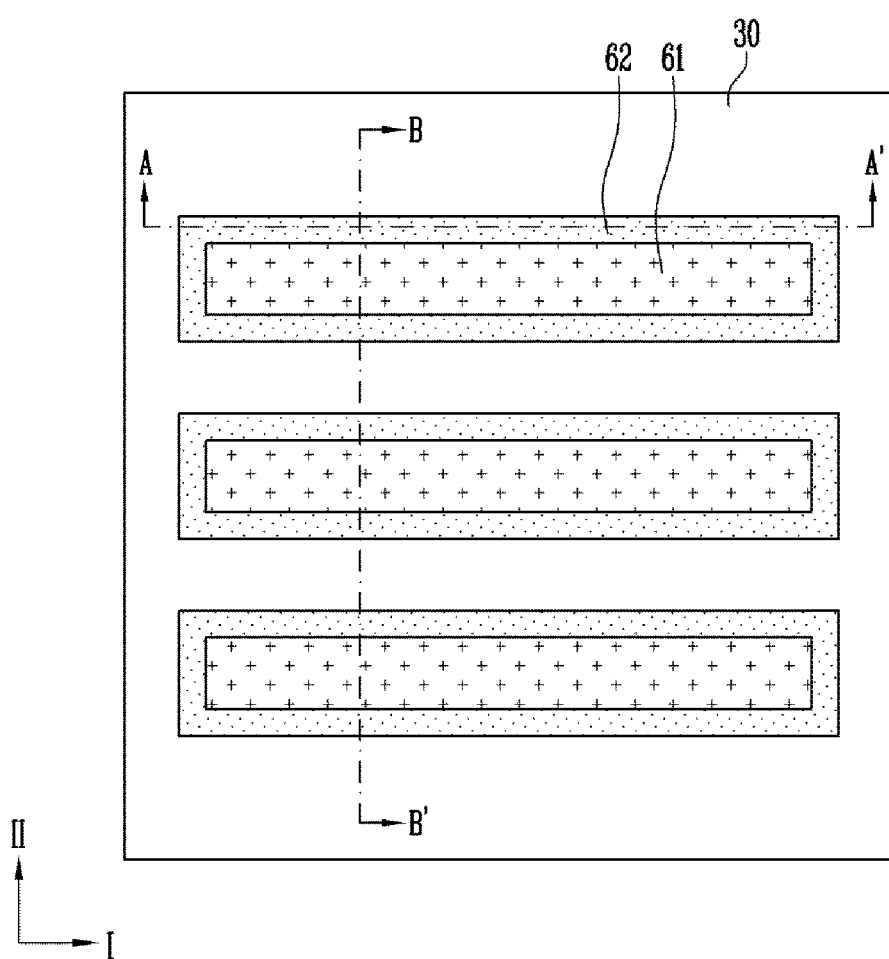
Figure 3B:
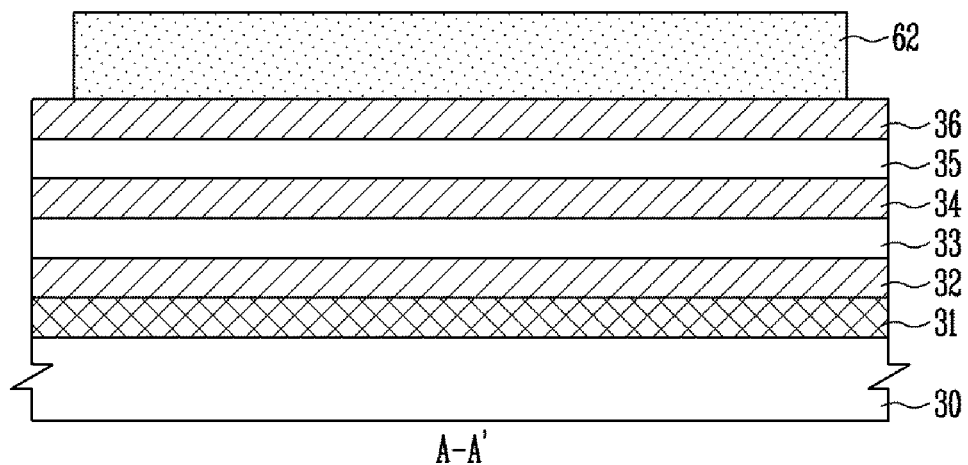
Figure 3C:
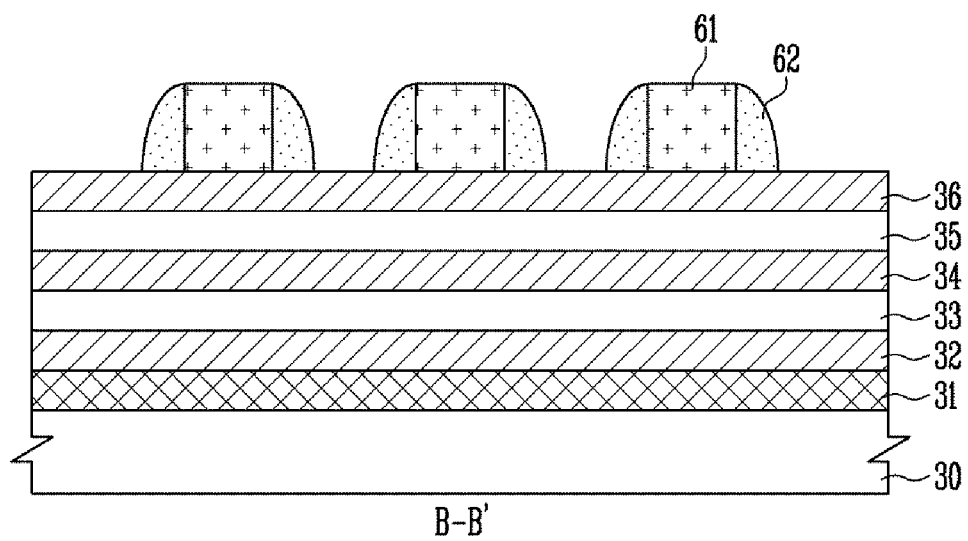

Referring to FIGS. 3A to 3C, first stack layers 31 to 36 may be formed on a base 30. The base 30 may be a semiconductor substrate and may include a lower structure which formed on the semiconductor substrate. For example, the base 30 may include a circuit formed on the semiconductor substrate. In another example, the base 30 may include an interconnection, such as a wire and a contact plug, or an interlayer insulating layer.

The first stack layers 31 to 36 may include a conductive layer and a variable resistance layer. For example, the first conductive layer 31, the lower electrode layer 32, the switching layer 33, the intermediate electrode layer 34, the variable resistance layer 35, and the upper electrode layer 36 may be formed above the base 30. The first conductive layer 31 may be configured to form wires, such as row lines and column lines, and may include metal such as tungsten. The first stack layers may include the first conductive layer 31, and may further include at least one of the lower electrode layer 32, the switching layer 33, the intermediate electrode layer 34, the variable resistance layer 35, and the upper electrode layer 36. In addition, although not illustrated in the FIGS. 3A to 3C, a hard mask layer may be further formed on the first stack layers 31 to 36.

Subsequently, a first sacrificial pattern 61 may be formed on the first stack structures 31 to 36. The first sacrificial pattern 61 may have a linear shape extending in the first direction I. In addition, the plurality of first sacrificial patterns 61 may be arranged to neighbor each other in the second direction II intersecting the first direction I. For example, the first sacrificial pattern 61 may include a photoresist.

Subsequently, a first spacer 62 may be formed on a sidewall of the first sacrificial pattern 61. For example, after forming a material layer for a spacer on a product where the first sacrificial pattern 61 is formed, the first spacer 62 may be formed by etching the material layer for the spacer by an etch back process. Accordingly, the first spacer 62 which has a closed-loop shape may be formed. A closed loop shape is a shape in which a contiguous structure encloses a space in the middle of the shape.

Figure 4B:
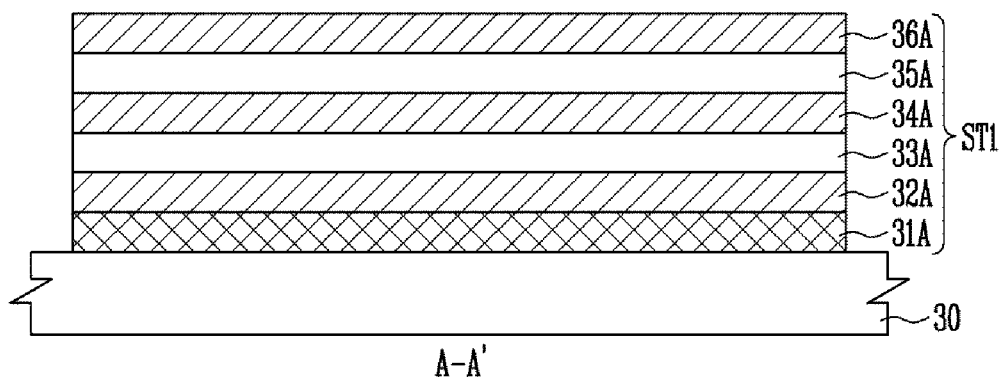
Figure 4C:
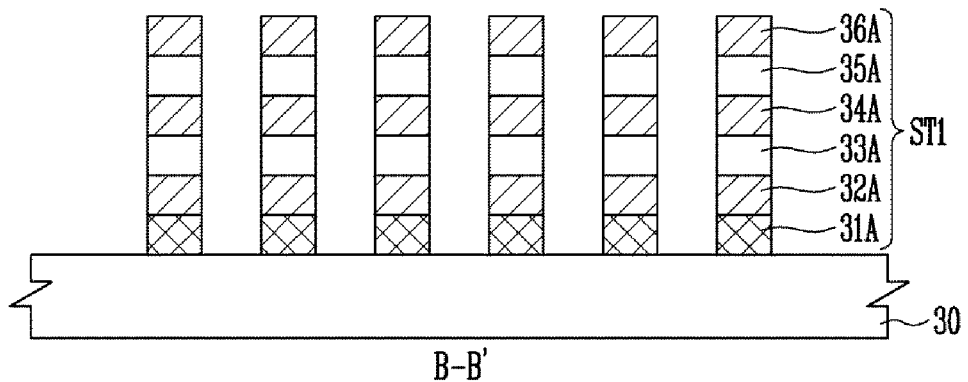

Referring to FIGS. 4A to 4C, after removing the first sacrificial pattern 61, the first stack layers 31 to 36 may be etched using the first spacer 62 as an etching barrier. A hard mask pattern may be formed on the first stack layers 31 to 36 by etching a hard mask layer (not illustrated) using the first spacer 62 as an etching barrier, and the first stack layers 31 to 36 may be etched using the hard mask pattern as an etching barrier. Accordingly, first stack structures ST1, which extend in the first direction I and have a closed-loop shape, may be formed. Each of the first stack structures ST1 may include a first conductive layer 31A, a lower electrode layer 32A, a switching layer 33A, an intermediate electrode layer 34A, a variable resistance layer 35A, and an upper electrode layer 36A. In addition, each of the first stack structures ST1 may include at least two line portions which extend in the first direction I and end portions which extend in the second direction II to couple end portions of the line portions. The first stack structures ST1 may be first conductive structures that include the first conductive layer 31A.

Figure 5A:
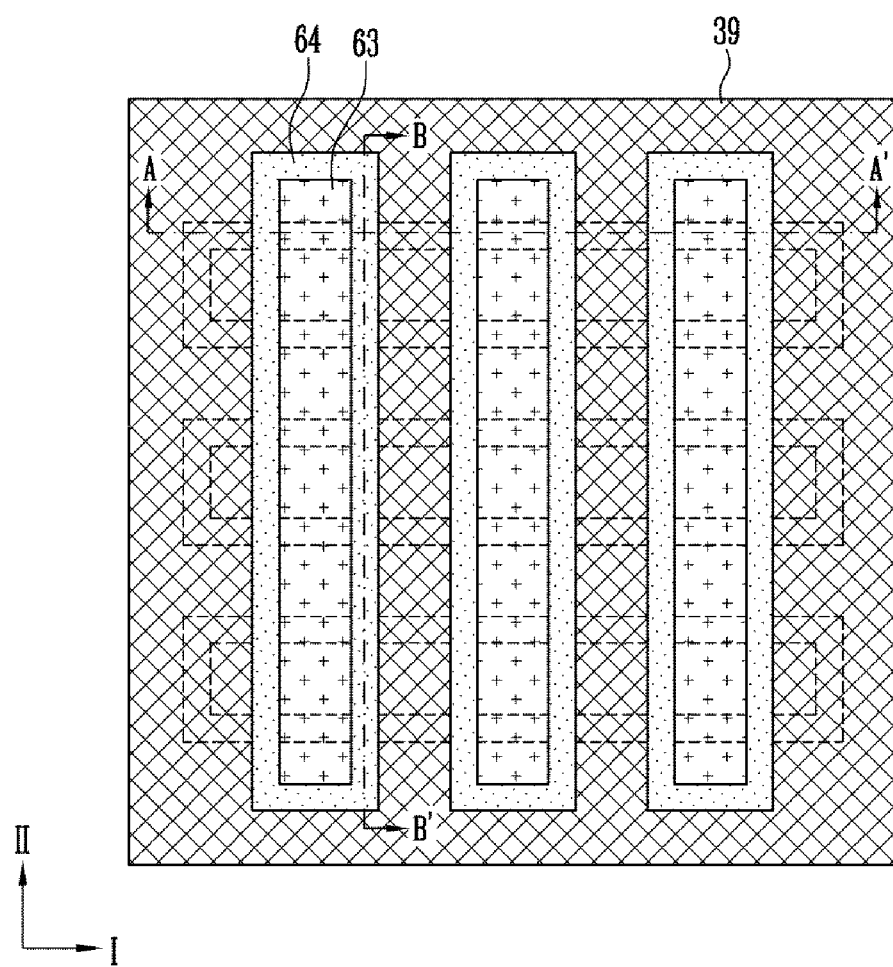
Figure 5B:
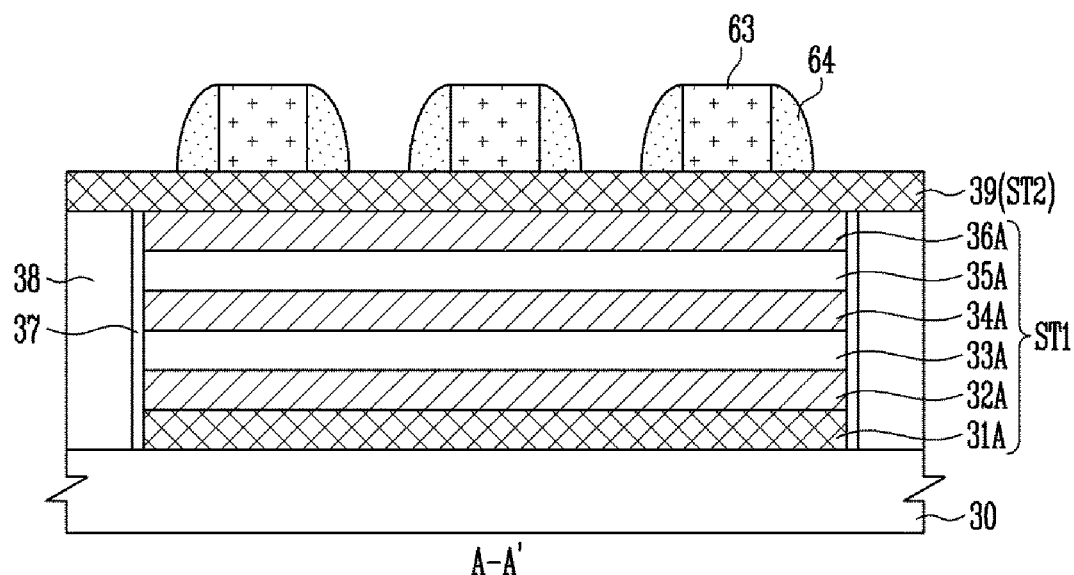
Figure 5C:
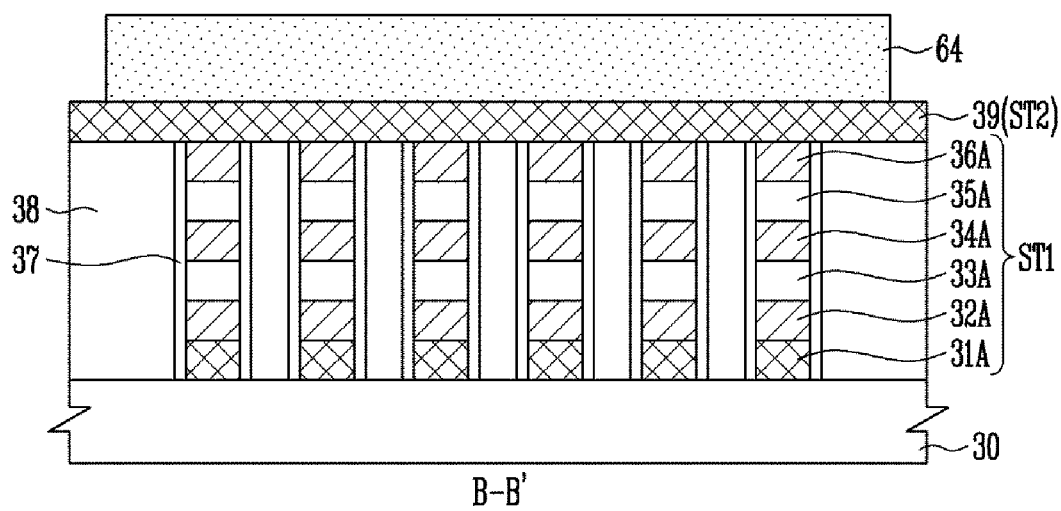

Referring to FIGS. 5A to 5C, a first liner layer 37 and a first gap-fill layer 38 may be formed between each neighboring pair of the first stack structures ST1. For example, after forming the first liner layer 37 to cover the first stack structures ST1, the first gap-fill layer 38 may be formed until a space between each neighboring pair of the first stack structures ST1 is filled. Subsequently, the first gap-fill layer 38 and the first liner layer 37 may be planarized to expose an upper surface of each of the first stack structures ST1. For example, the first gap-fill layer 38 and the first liner layer 37 may be planarized to expose an upper surface of the upper electrode layer 36A. In some embodiments, although not shown in the figures, a portion of first liner layer 37 may remain on portions of the base 30 between adjacent first stack structures ST1. In addition, the first liner layer 37 may be formed in the middle of etching the first stack structure ST1. For example, the first liner layer 37 may be formed after the variable resistance layer 35A is etched and/or after the lower electrode layer 32A is etched. In addition, the first liner layer 37 may not be formed on the sidewall of the first conductive layer 31A.

Subsequently, second stack layers may be formed on the first liner layer 37, the first gap-fill layer 38, and the first stack structures ST1. The second stack layers may include a second conductive layer 39, a hard mask layer (not illustrated), and the like. The second conductive layer 39 may be configured to form wires, such as row lines and column lines, and may include metal such as tungsten. In addition, the second stack layers may further include at least one of a lower electrode layer, a switching layer, an intermediate electrode layer, a variable resistance layer, and an upper electrode layer.

Subsequently, a second sacrificial pattern 63 may be formed on the second conductive layer 39. The second sacrificial pattern 63 may have a linear shape extending in the second direction II. In addition, a plurality of second sacrificial patterns 63 may be arranged to neighbor each other in the first direction I. In an embodiment, the second sacrificial pattern 63 may include a photoresist.

Subsequently, a second spacer 64 may be formed on a sidewall of the second sacrificial pattern 63. For example, after forming a layer of spacer material over the second conductive layer 39 and the second sacrificial pattern 63, the second spacer 64 may be formed by etching the spacer material by an etch back process. Accordingly, the second spacer 64 which has a closed-loop shape may be formed.

Figure 6B:
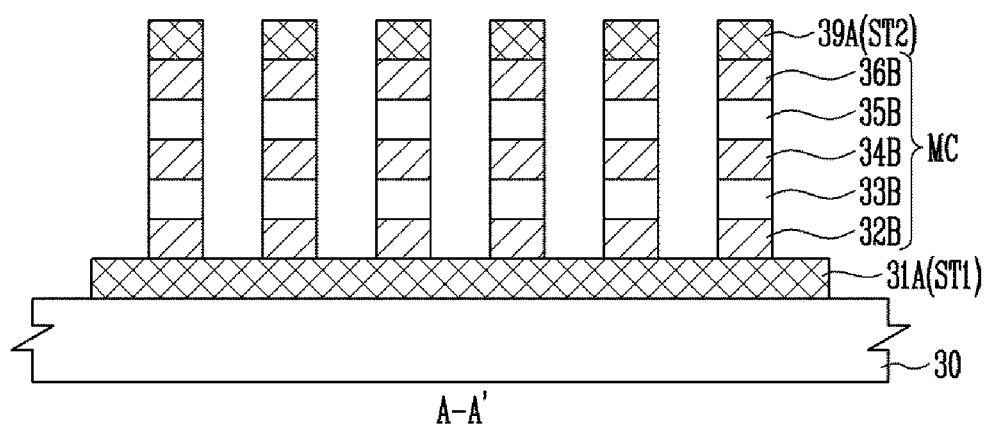
Figure 6C:
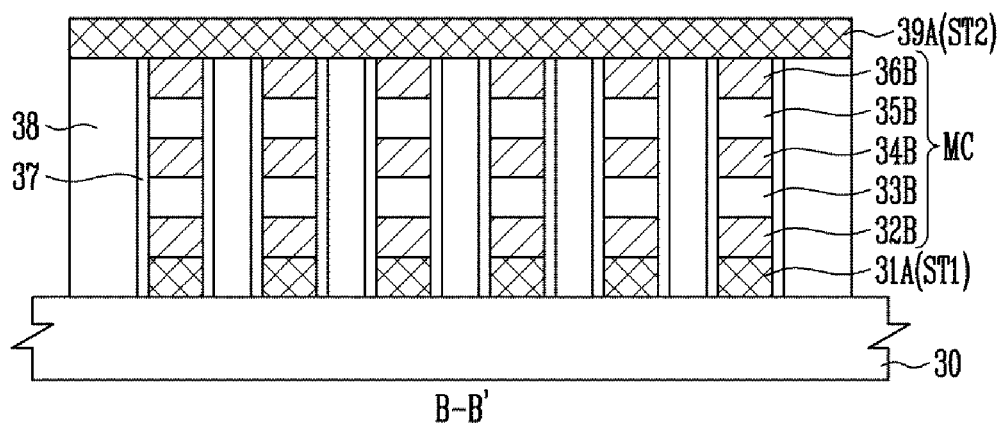

Referring to FIGS. 6A to 6C, the second stack layers may be etched using the second spacer 64 as an etching barrier after removing the second sacrificial pattern 63. After forming a hard mask pattern by etching a hard mask layer (not illustrated), the second conductive layer 39 may be etched using the hard mask pattern as an etching barrier. Accordingly, second stack structures ST2, which extend in the second direction II and have a closed-loop shape, may be formed. Each of the second stack structures ST2 may include at least two line portions which extend in the second direction II and end portions which extend in the first direction I to couple end portions of the line portions. As seen in FIG. 6A, the line portions of the second stack structures ST2 may intersect the line portions of the first stack structures ST1. The end portions of the second stack structures ST2 and the end portions of the first stack structures ST1 may not overlap each other. Each of the second stack structures ST2 may be referred to as a second conductive structure that includes the second conductive layer 39.

Subsequently, the first stack structures ST1 may be etched using the hard mask pattern as an etching barrier. Some layers of each of the first stack structures ST1 may be etched. For example, the lower electrode layer 32A, the switching layer 33A, the intermediate electrode layer 34A, the variable resistance layer 35A and the upper electrode layer 36A may be etched. Accordingly, the memory cells MC disposed at intersections of the first stack structures ST1 and the second stack structures ST2 may be formed. Each of the memory cells MC may include a lower electrode 32B, a switching pattern 33B, an intermediate electrode 34B, a variable resistance pattern 35B, and an upper electrode pattern 36B. The first conductive layer 31A may not be etched so that the first conductive layer 31A maintains its closed-loop shape.

Figure 7A:
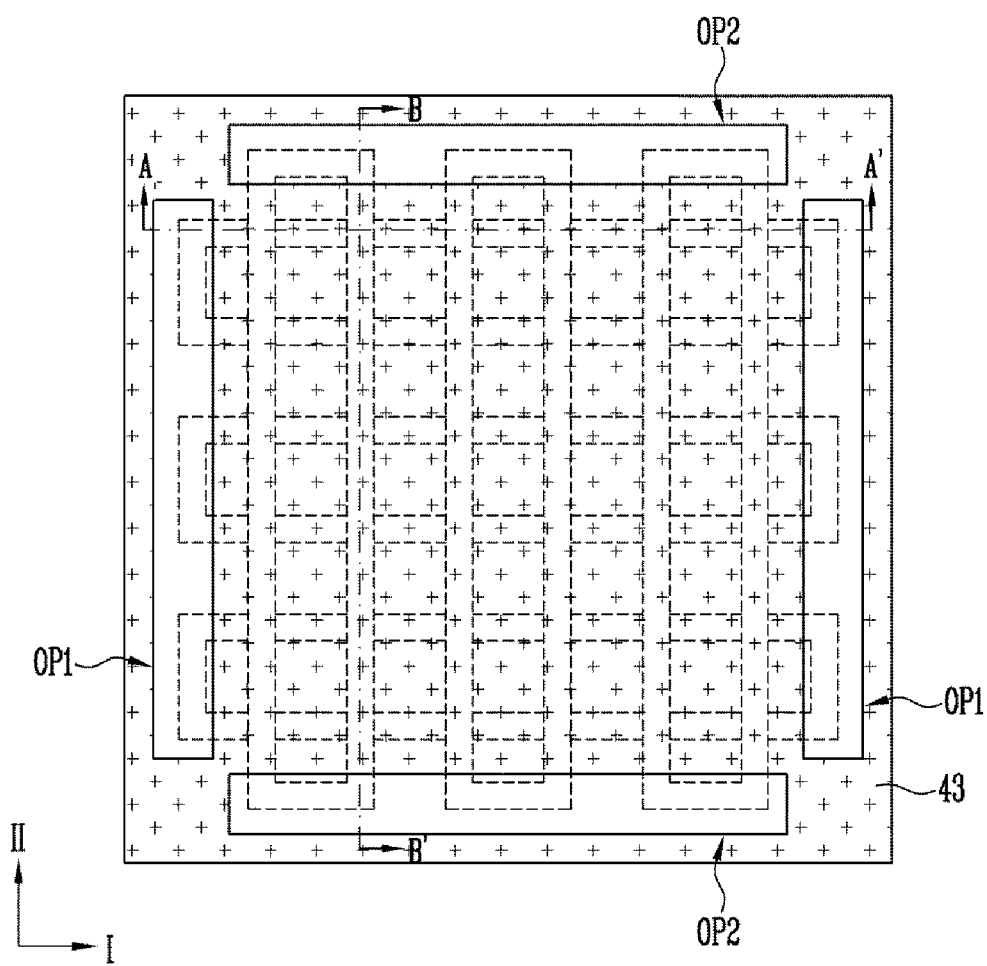
Figure 7B:
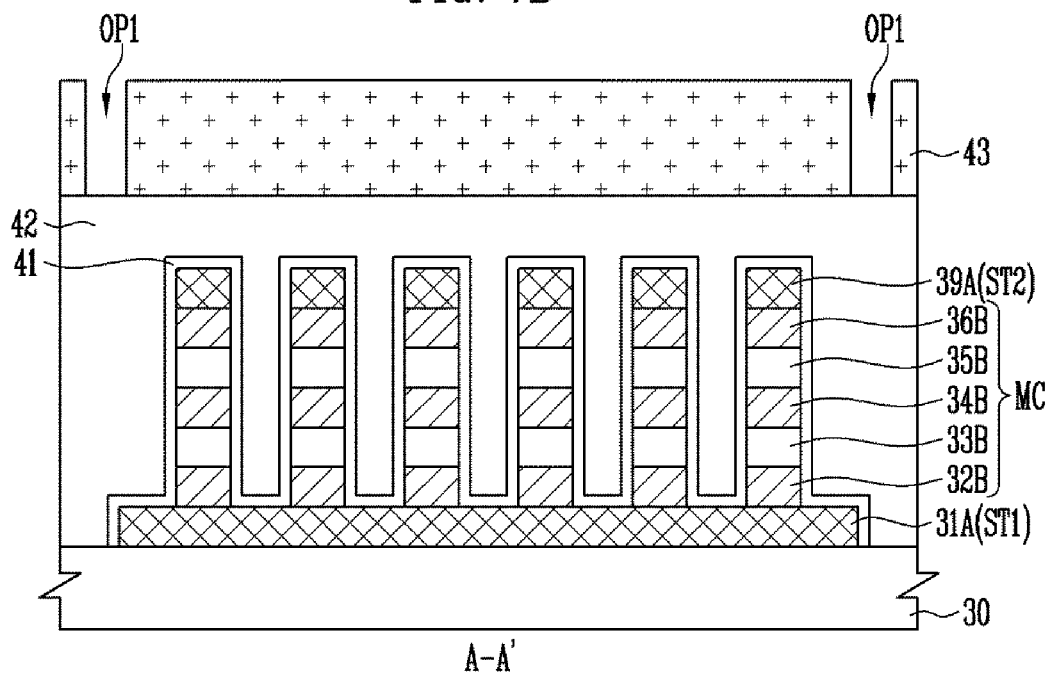
Figure 7C:
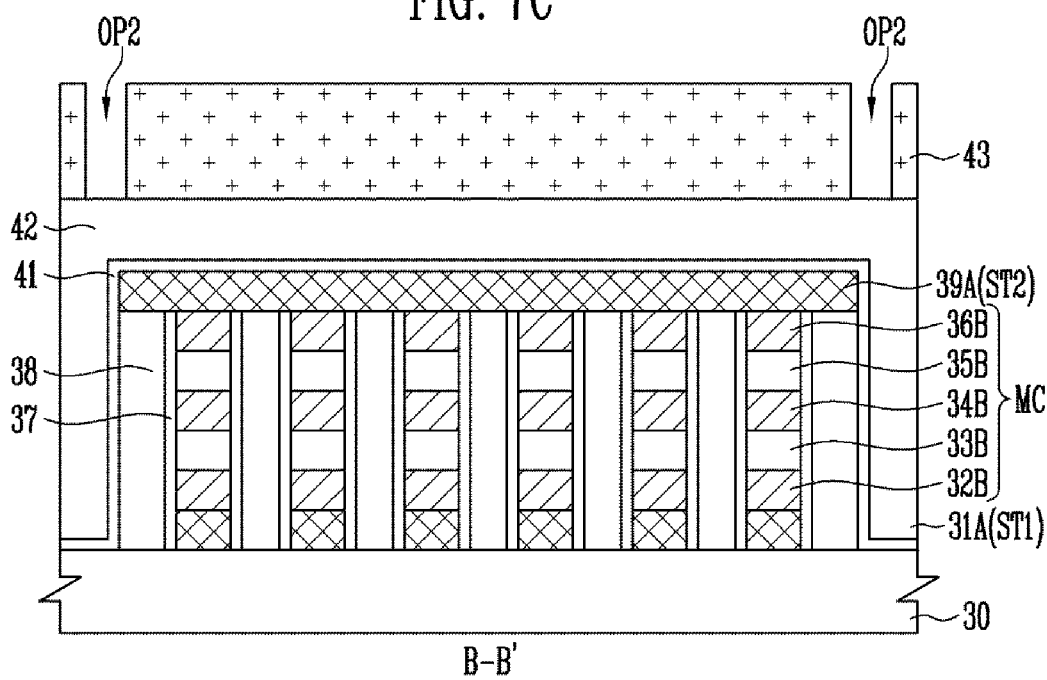

Referring to FIGS. 7A to 7C, a second liner layer 41 and a second gap-fill layer 42 may be formed on the second stack structures ST2. For example, after forming the second liner layer 41 to cover the second stack structures ST2, the second gap-fill layer 42 may be formed to fill a space between each neighboring pair of the second stack structures ST2. The second liner layer 41 may also be formed on exposed sidewalls of each of the memory cells MC and the second gap-fill layer 42 may fill a space between each neighboring pair of the memory cells MC.

Subsequently, a mask pattern 43 may be formed on the second gap-fill layer 42. The mask pattern 43 may include first openings OP1 exposing the end portions of each of the first stack structures ST1 and second openings OP2 exposing the end portions of each of the second stack structures ST2.

Figure 11:
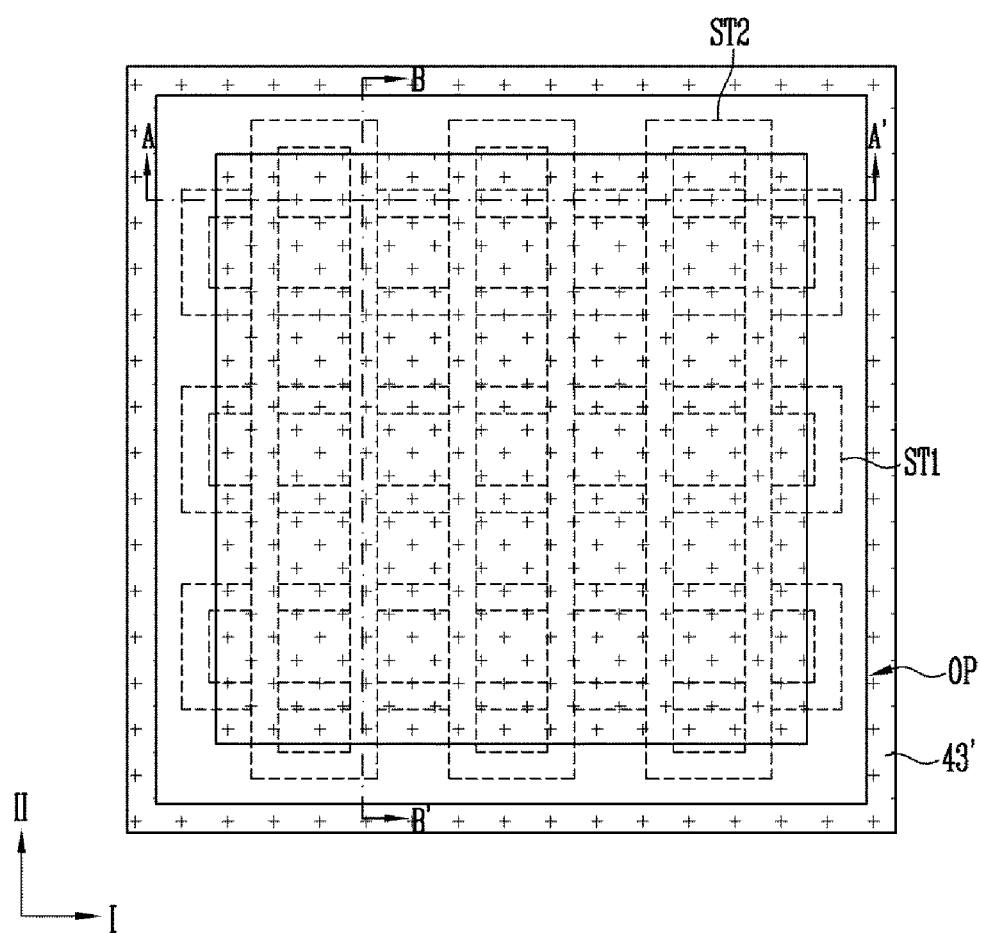

Although FIGS. 7A to 7C illustrate a structure in which the first openings OP1 and the second openings OP2 are separated from each other, the first openings OP1 and the second openings OP2 may be connected to each other in a single contiguous opening. For example, FIG. 11 shows a mask pattern 43' that includes an opening OP with a closed-loop shape that exposes the end portions of each of the first stack structures ST1 and the end portions of each of the second stack structures ST2. Accordingly, the end portions of each of the first stack structures ST1 and the end portions of each of the second stack structures ST2 may be etched using the mask pattern 43' of FIG. 11, instead of the mask pattern 43 of FIG. 7A, as an etching barrier.

Figure 8A:
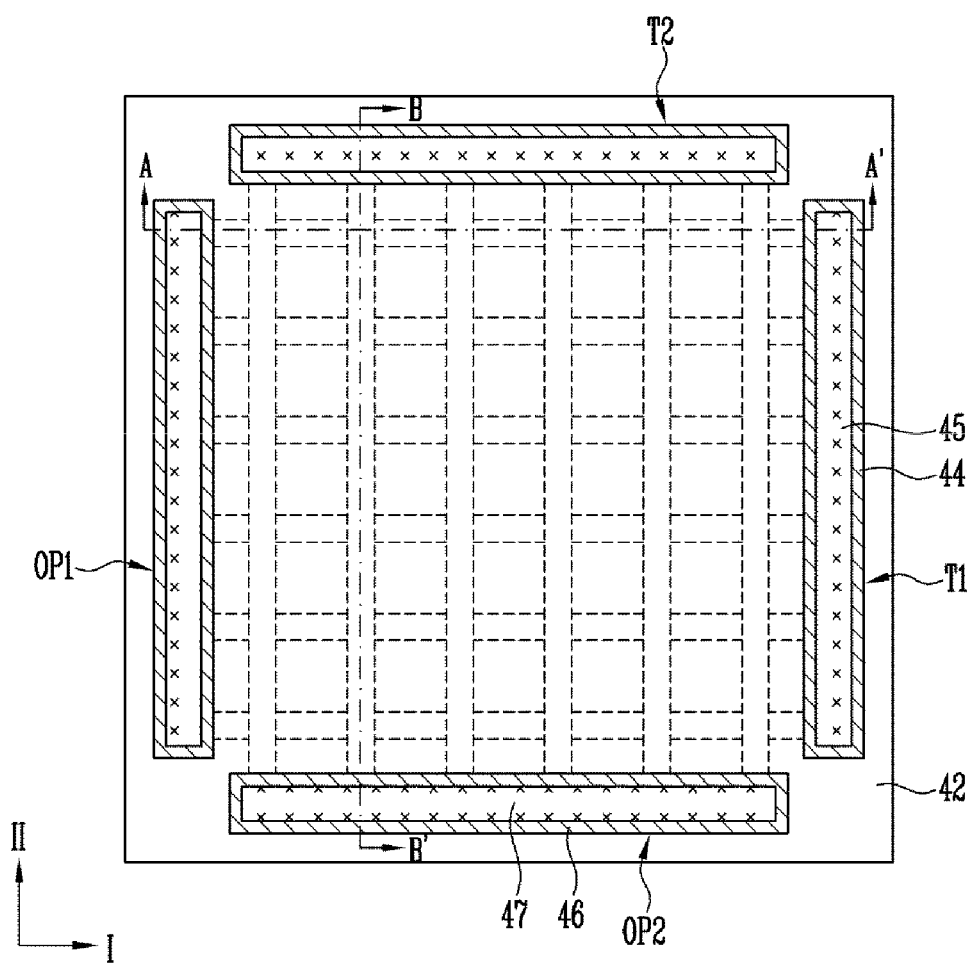
Figure 8B:
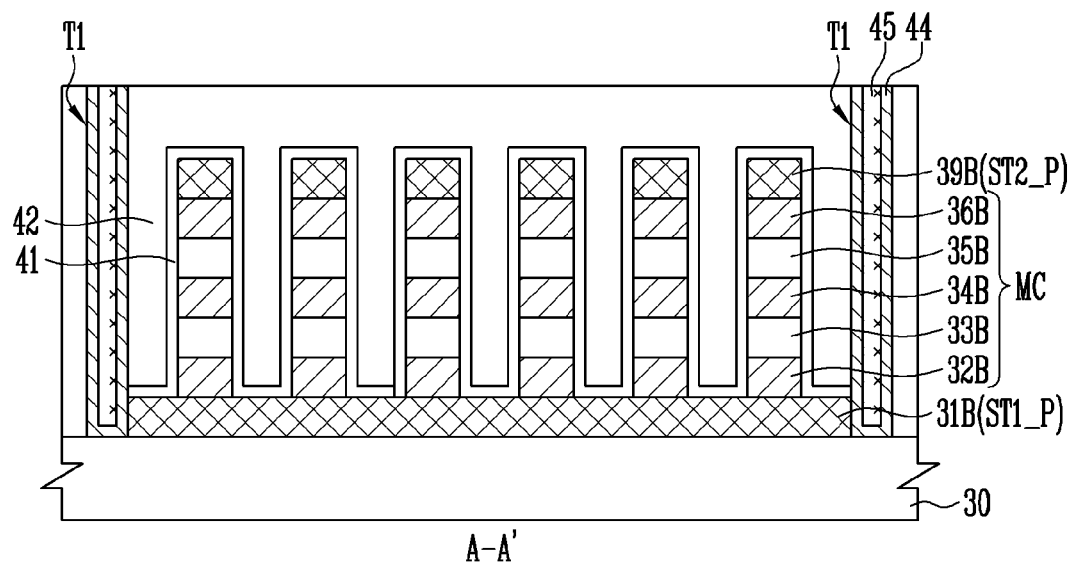
Figure 8C:
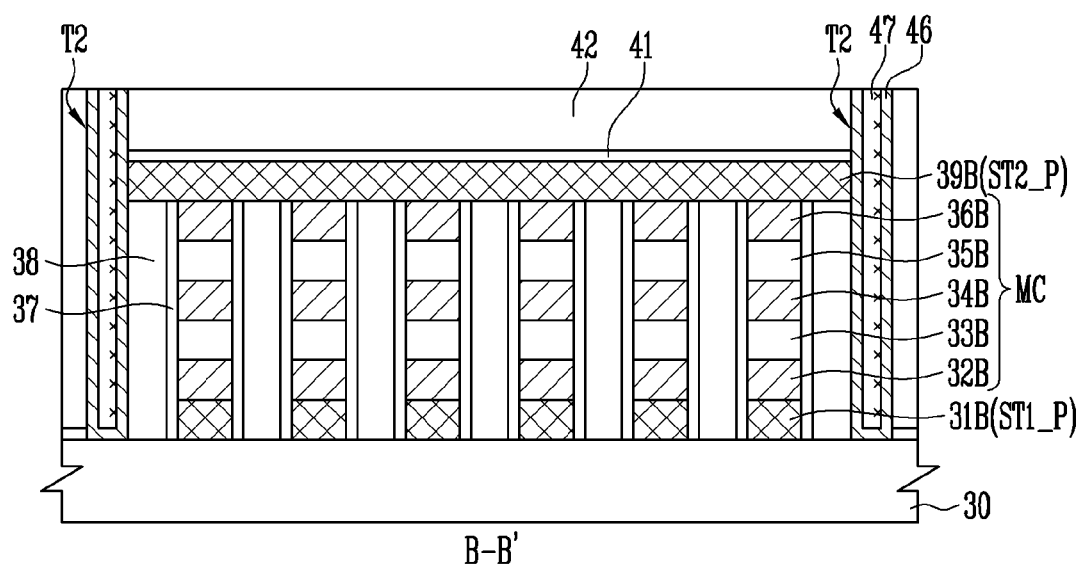

Referring to FIGS. 8A to 8C, the end portions of the second stack structures ST2 and the first stack structures ST1 may be etched using the mask pattern 43 as an etching barrier. For example, second stack patterns ST2_P may be formed by etching the end portions of each of the second stack structures ST2 having a closed-loop shape. In addition, first stack patterns ST1_P may be formed by etching the end portions of each of the first conductive layers 31A having a closed-loop shape. Accordingly, the second stack patterns ST2_P, which are line patterns that extend in parallel with each other in the second direction II and which are spaced apart from each other, may be formed. In addition, the first stack patterns ST1_P, which are line patterns that extend in parallel with each other in the first direction I and which are spaced apart from each other, may be formed.

With reference to the first and second conductive layers 31A and 39A, second conductive patterns 39B may be formed by etching end portions of each of the second conductive structures and first conductive patterns 31B may be formed by etching end portions of each of the first conductive structures. The second conductive patterns 39B may extend in parallel with each other in the second direction II and may be separated from each other. In addition, the first conductive patterns 31B may extend in parallel with each other in the first direction I and may be separated from each other.

When the end portions of each of the second stack structures ST2 and the end portions of each of the first stack structures ST1 are etched, the second gap-fill layer 42, the second liner layer 41, the first gap-fill layer 38, and the like may also be etched. Accordingly, the first trenches T1 which correspond to the first openings OP1 of the mask pattern 43 and the second trenches T2 which correspond to the second openings OP2 of the mask pattern 43 may be formed. The first trenches T1 may have a linear shape extending in the second direction II, and the second trenches T2 may have a linear shape extending in the first direction I. In addition, the first trenches T1 may be formed at the same time as the second trenches T2 by the same etching process. Thus, in an embodiment, first trenches T1 and the second trenches T2 may have substantially the same depth.

The first trenches T1 may be formed by etching the second gap-fill layer 42 and the first conductive layer 31A. In addition, the first trenches T1 may expose sidewalls at ends of each of the first stack patterns ST1_P or sidewalls at ends of each of the first conductive patterns 31B. Accordingly, the sidewalls of the first conductive patterns 31B facing the first direction I may be exposed by the first trenches T1.

The second trenches T2 may be formed by etching the second gap-fill layer 42, the second liner layer 41, and the second conductive layer 39A. In addition, the second trenches T2 may expose sidewalls at ends of each of the second stack patterns ST2_P or sidewalls at ends of each of the second conductive pattern 39B. Accordingly, sidewalls of the second conductive patterns 39B facing the second direction II may be exposed by the second trenches T2.

Subsequently, a first protective layer 44 and a third gap-fill layer 45 may be formed in each of the first trenches T1. For example, after the first protective layer 44 is formed over exposed surfaces of each of the first trenches T1, the third gap-fill layer 45 may be formed to fill the each of the first trenches T1. The first protective layer 44 may be interposed between each of the first stack patterns ST1_P and the third gap-fill layer 45, and may separate each of the first stack patterns ST1_P from the third gap-fill layer 45. In an embodiment, the first protective layer 44 may include a nitride, and the third gap-fill layer 45 may include an oxide.

The first protective layer 44 may be configured to protect the etched surfaces of the first stack patterns ST1_P exposed by the first trenches T1. When the first conductive patterns 31B include metal such as tungsten and the third gap-fill layer 45 includes an oxide, if the third gap-fill layer 45 contacts the first conductive patterns 31B, the etched surface of the first conductive patterns 31B may cause a defect. In particular, performing a subsequent heat treatment process may cause the etched surface of the first conductive patterns 31B to grow abnormally, so that the metal material of one of the first conductive patterns 31B becomes electrically coupled to a neighboring first conductive pattern 31B. In an embodiment of the present disclosure, when the first protective layer 44 is formed on the etched surface of the first conductive patterns 31B, abnormal growth of the etched surface of the first conductive patterns 31B may be prevented. Accordingly, the first conductive patterns 31B may remain separated from each other.

Similarly, a second protective layer 46 and a fourth gap-fill layer 47 may be formed in each of the second trenches T2. For example, after forming the second protective layer 46 over inner surfaces of each of the second trenches T2, the fourth gap-fill layer 47 may be formed to fill each of the second trenches T2. The second protective layer 46 may include the same material as the first protective layer 44, and the second protective layer 46 may be formed when the first protective layer 44 is formed. In addition, the fourth gap-fill layer 47 may include the same material as the third gap-fill layer 45, and the fourth gap-fill layer 47 may be formed when the third gap-fill layer 45 is formed.

Accordingly, the first protective layer 44 may be formed on sidewalls of the first conductive patterns 31B, and the first protective layers 44 may be formed on sidewalls of the first conductive patterns 31B which face the first direction I. In addition, the second liner layers 41 may be formed on sidewalls of the second conductive patterns 39B which face the first direction I, and the second protective layers 46 may be formed on the sidewalls of the second conductive patterns 39B which face the second direction II.

According to the fabricating process described above, even when end portions of the first stack structures ST1 and the second stack structures ST2 which have a closed-loop shape are removed to expose surfaces of the first conductive patterns 31B and the second conductive patterns 39B, abnormal growth of a conductive material from the exposed surfaces may be prevented. Accordingly, embodiments of the present disclosure may prevent operational errors caused by electrical bridges between adjacent conductive patterns.

Figure 9A:
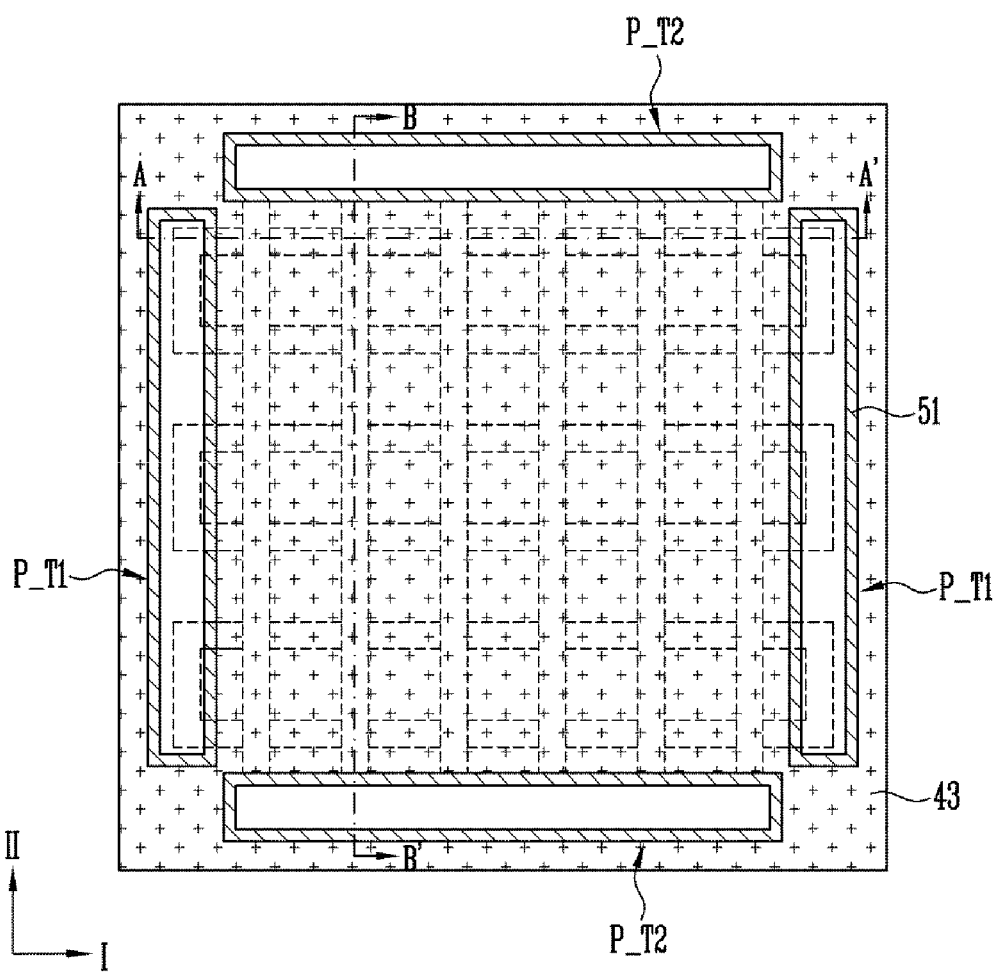
FIGS. 9A to 9C and 10A to 10C are diagrams illustrating a method of fabricating an electronic device including a semiconductor memory according to an embodiment of the present disclosure.
Figure 9B:
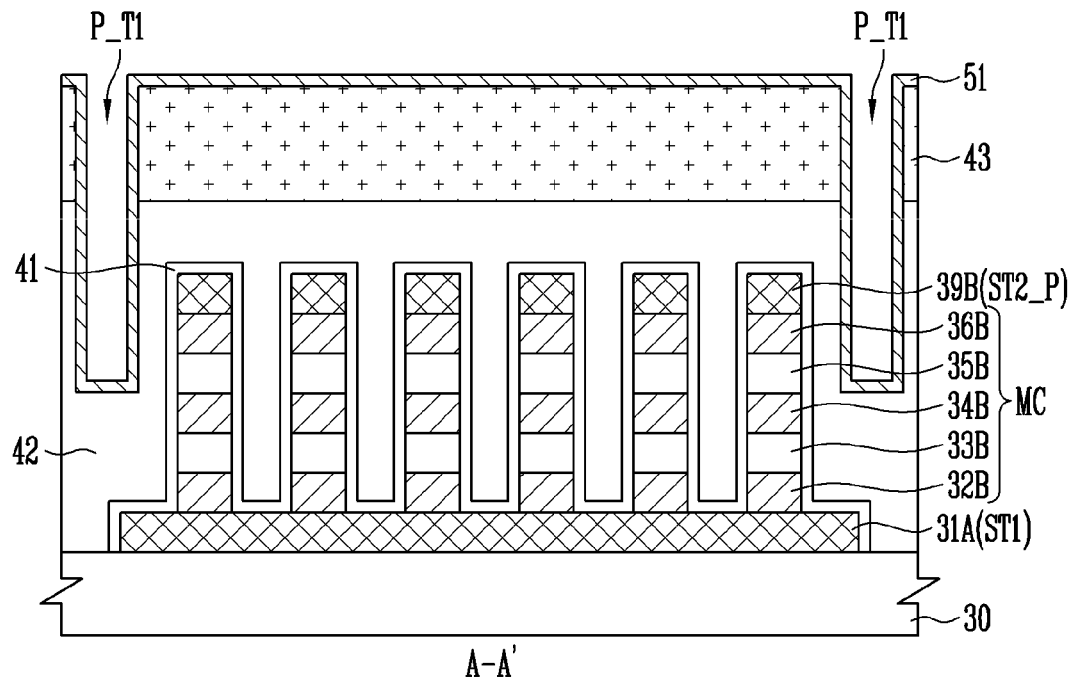
Figure 9C:
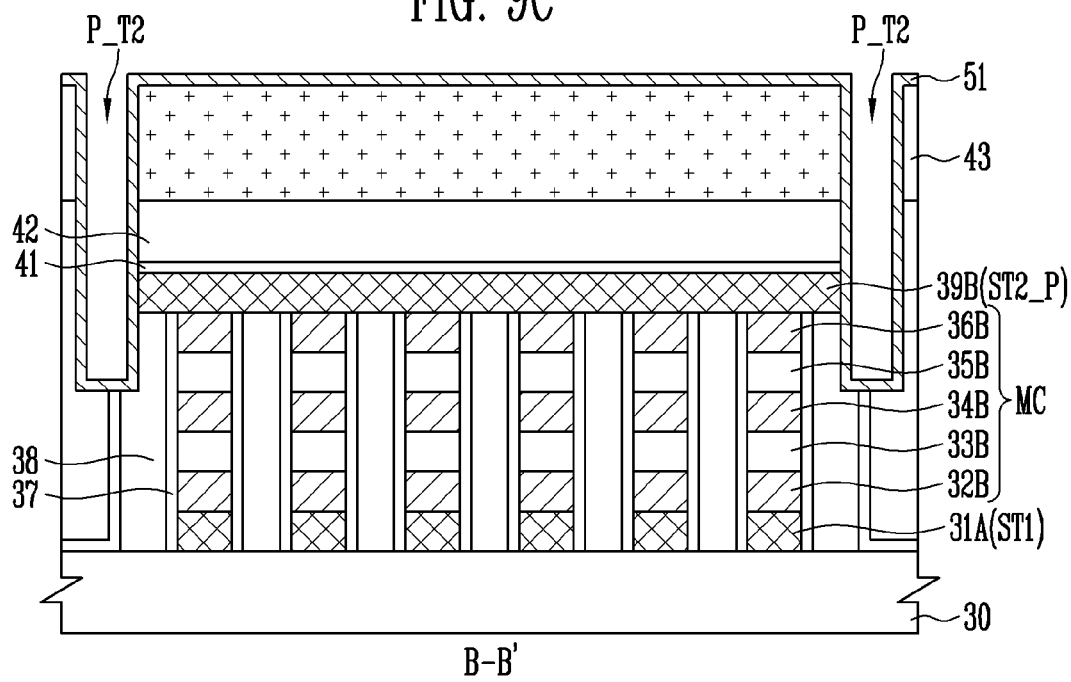
Figure 10A:
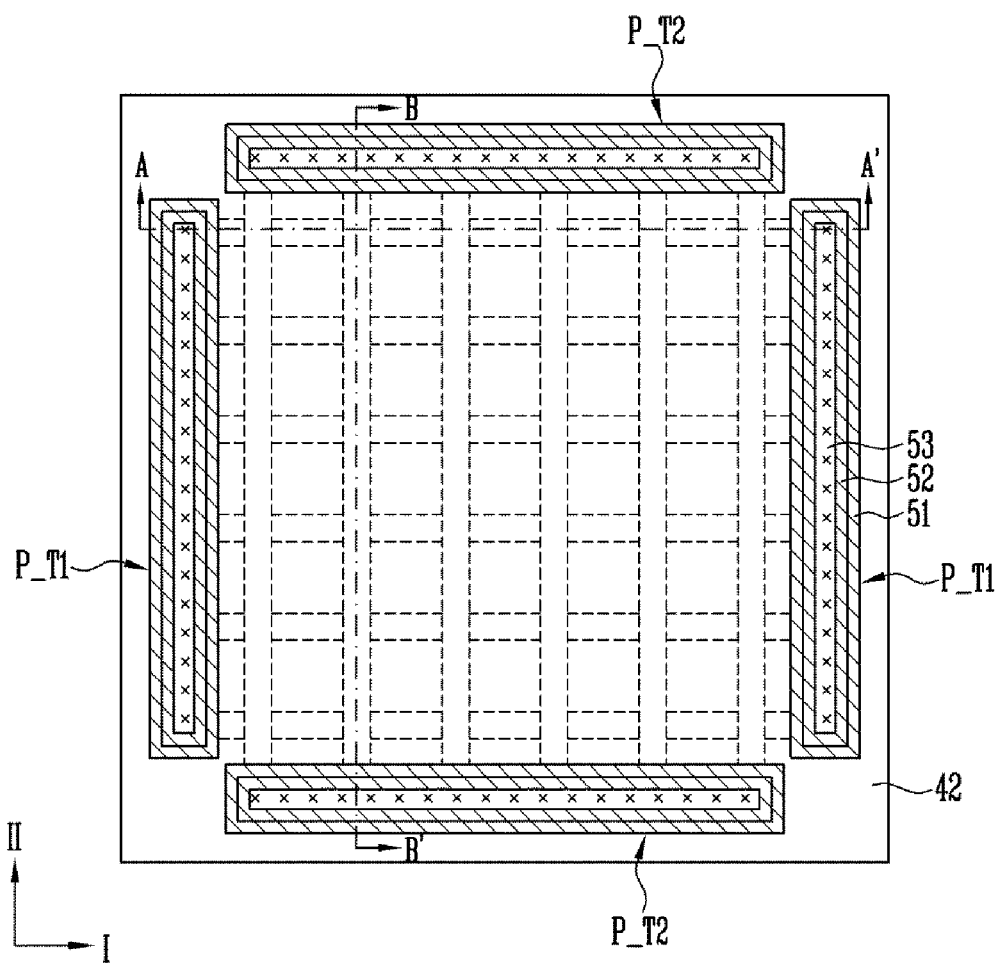
Figure 10B:
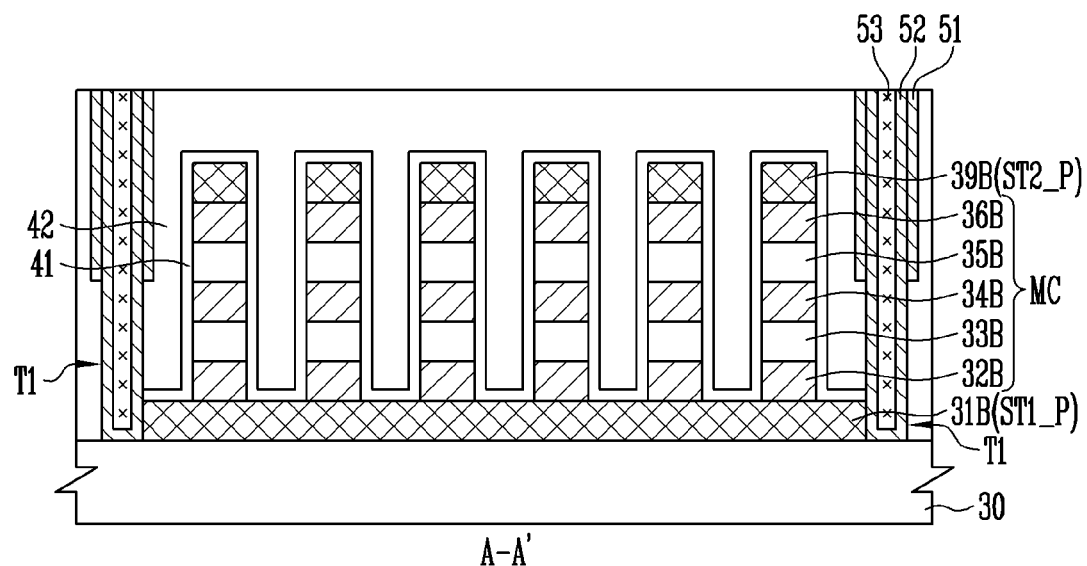
Figure 10C:
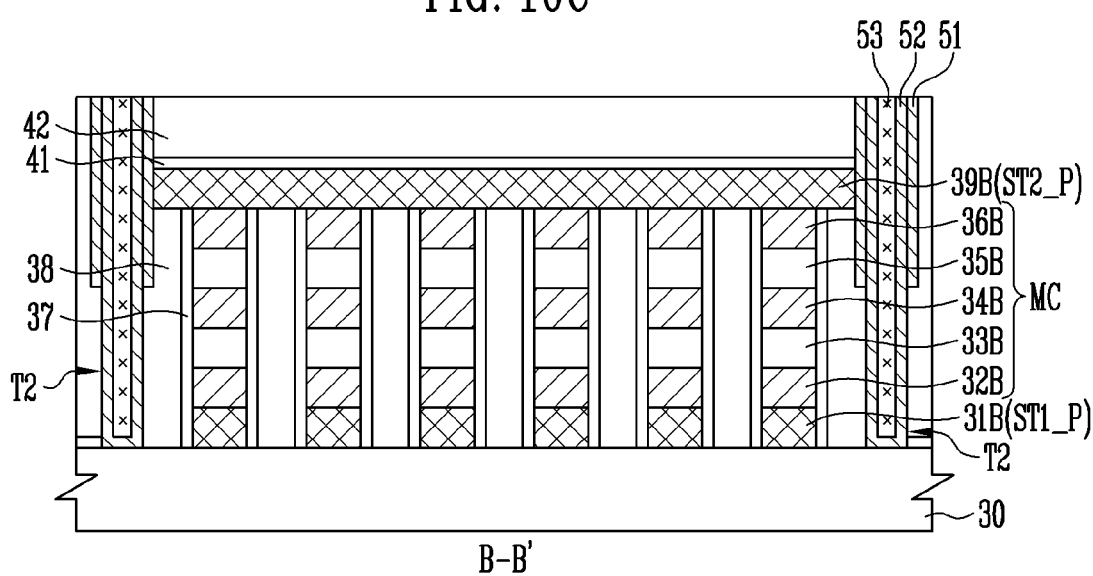

FIGS. 9A to 9C and 10A to 10C are diagrams illustrating a method of fabricating an electronic device including a semiconductor memory according to embodiments of the present disclosure. FIGS. 9A and 10A are layout views, and illustrate a device with respect to the first direction I and the second direction II. FIGS. 9B and 10B are cross-sectional diagrams taken along line A-A' of FIGS. 9A and 10A, respectively. FIGS. 9C and 10C are cross-sectional diagrams taken along line B-B' of FIGS. 9A and 10A, respectively.

The embodiments shown in these figures relate to a method for fabricating the first trenches T1. According to these embodiments, the first trenches T1 are formed by a series of steps. The following description is performed on a structure such as the structure shown in FIGS. 7A to 7C which has a mask pattern 43 disposed over a plurality of memory cells MC. The fabricating method described above with reference to FIGS. 3A to 7A, 3B to 7B, and 3C to 7C may be performed before forming the mask pattern 43. A detailed description of components already described above will be omitted for the sake of brevity.

Referring to FIGS. 9A to 9C, preliminary first trenches P_T1 may be formed by etching the second gap-fill layer 42 using mask pattern 43 as an etching barrier. The preliminary first trenches P_T1 may have a depth sufficient to partially pass through the second gap-fill layer 42 without exposing the first conductive layers 31A.

In addition, when the preliminary first trenches P_T1 are formed, preliminary second trenches P_T2 may be formed. In a process in which the preliminary second trenches P_T2 are formed, the end portions of the second stack structures ST2 may be etched, so that the etched surfaces of the second conductive patterns 39B are exposed by the preliminary second trenches P_T2. The preliminary second trenches P_T2 may have substantially the same depth as the preliminary first trenches P_T1, and may be formed by the same etching process.

Subsequently, a third protective layer 51 may be formed in the preliminary first trenches P_T1 and the preliminary second trenches P_T2. The third protective layer 51 may be configured to protect the exposed etched surfaces of the second conductive patterns 39B, and may include, for example, a nitride material.

Referring to FIGS. 10A to 10C, the first trenches T1 may be formed by etching the second gap-fill layer 42 using the mask pattern 43 as an etching barrier. When the first trenches T1 are formed, the end portions of the first stack structures ST1 may be etched, and the etched surfaces of the first conductive patterns 31B may be exposed through the first trenches T1. When the first trenches T1 are formed, the etching process may be performed so that portions of the third protective layer 51 remain over sidewalls of the preliminary trenches P_T1. Thus, an upper portion of each of the first trenches T1 may have a greater width than a lower portion of each of the first trenches T1.

The second trenches T2 may be formed at the same time as the first trenches T1 by the same etching process, so the second trenches T2 may have substantially the same depth as the first trenches T1. In addition, since the etched surface of the second conductive patterns 39B is protected by the third protective layer 51, damage to the second conductive patterns 39B may be prevented.

Subsequently, a fourth protective layer 52 and a fifth gap-fill layer 53 may be formed in the first and second trenches T1 and T2. The fourth protective layer 52 may be configured to protect etched surfaces of the first conductive patterns 31B and may include a nitride material. In addition, the fifth gap-fill layer 53 may include an oxide. In a resulting structure, the fourth protective layer 52 may be interposed between each of the first conductive patterns 31B and the fifth gap-fill layer 53, and the third and fourth protective layers 51 and 52 may be interposed between each of the second conductive patterns 39B and the fifth gap-fill layer 53. Accordingly, abnormal growth of the first and second conductive patterns 31B and 39B may be prevented. In an embodiment, the third protective layer 51 may be removed before the fourth protective layer 52 is formed.

The manufacturing methods described above may prevent damage to the etched surface of the second conductive patterns 39B during the process of forming the first conductive patterns 31B.

Figure 12:
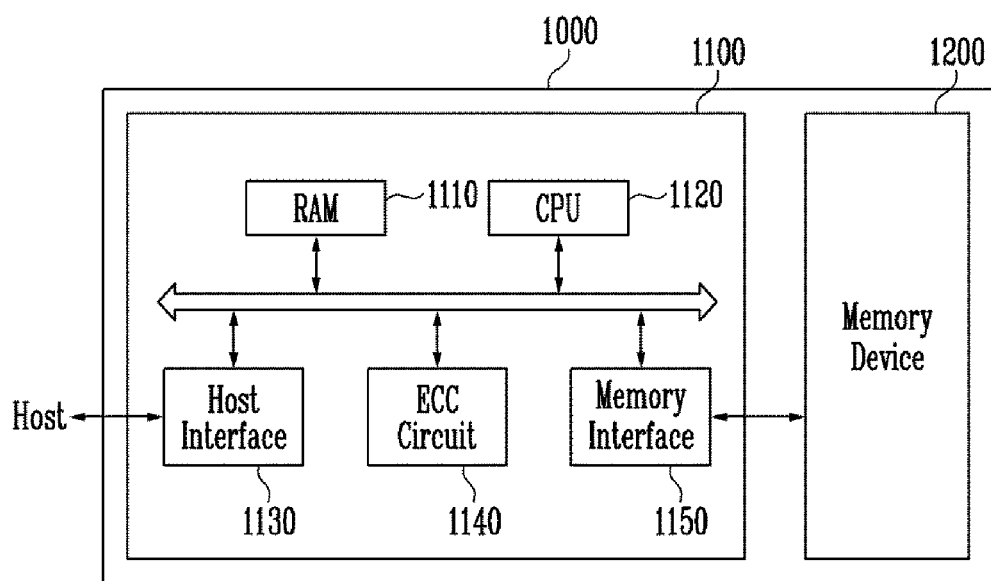
FIGS. 12 and 13 are block diagrams illustrating the configuration of a memory system according to an embodiment of the present disclosure.

FIG. 12 is a block diagram illustrating the configuration of a memory system 1000 according to an embodiment of the present disclosure.

Referring to FIG. 12, the memory system 1000 according to an embodiment of the present disclosure may include a memory device 1200 and a controller 1100.

The memory device 1200 may be used to store data information having various data formats such as a text format, a graphical format, and a software code format. The memory device 1200 may be a non-volatile memory. Furthermore, the memory device 1200 may have the structures described above with reference to FIGS. 1A to 11, and may be manufactured by the fabricating method described above with reference to FIGS. 1A to 11. According to an embodiment, the memory device 1200 may include first conductive patterns extending in a first direction, second conductive patterns extending in a second direction which intersects the first direction, first gap-fill layers between the first conductive patterns, second gap-fill layers between the second conductive patterns, a first trench that passes through the second gap-fill layers and that exposes sidewalls of the first conductive patterns which face each other in the first direction, a third gap-fill layer formed in the first trench, and a first protective layer that is formed in the first trench and that is interposed between the first conductive patterns and the third gap-fill layer. Since the structure of the memory device 1200 and the fabricating method thereof are the same as those described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a Random Access Memory (RAM) 1110, a Central Processing Unit (CPU) 1120, a host interface 1130, an Error Correction Code (ECC) circuit 1140, and a memory interface 1150.

The RAM 1110 may serve as an operation memory of the CPU 1120, a cache memory between the memory device 1200 and the host, a buffer memory between the memory device 1200 and the host, or the like. The RAM 1110 may be replaced with a Static Random Access Memory (SRAM), a Read Only Memory (ROM), or the like.

The CPU 1120 may control the overall operation of the controller 1100. For example, the CPU 1120 may operate firmware, such as a Flash Translation Layer (FTL), stored in the RAM 1110.

The host interface 1130 may interface with the host. For example, the controller 1100 may communicate with the host through at least one of various interface protocols such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, and an Integrated Drive Electronics (IDE) protocol, a private protocol, and the like.

The ECC circuit 1140 may use an Error Correction Code (ECC) to detect and correct errors in data read from the memory device 1200.

The memory interface 1150 may interface with the memory device 1200. For example, the memory interface 1150 may include a NAND interface or a NOR interface.

The controller 1100 may further include a buffer memory (not illustrated) for temporarily storing data. The buffer memory may be used to temporarily store data to be transferred to an external device through the host interface 1130 or data to be transferred from the memory device 1200 through the memory interface 1150. The controller 1100 may further include a ROM which stores code data for interfacing with the host.

Since the memory system 1000 according to the embodiment of the present disclosure includes the memory device 1200 having increased integration density and improved characteristics, the memory system 1000 may also have improved integration density and characteristics accordingly.

Figure 13:
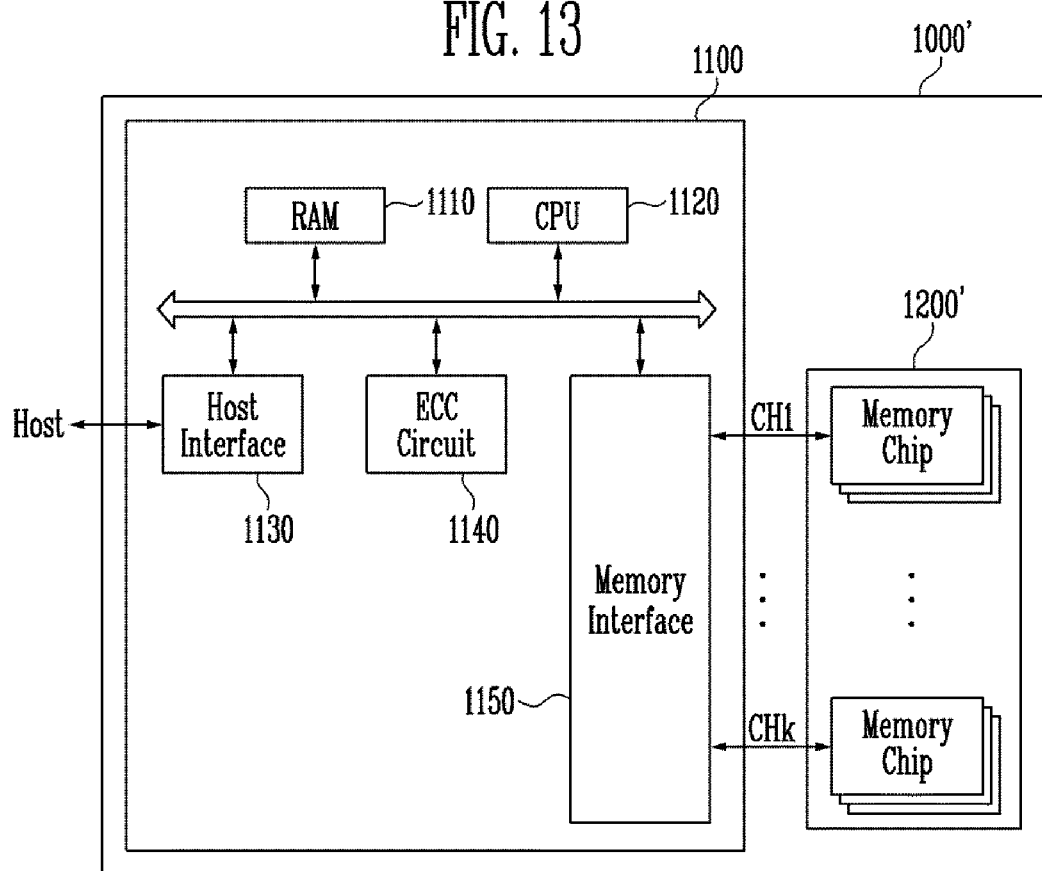

FIG. 13 is a block diagram illustrating the configuration of a memory system 1000' according to an embodiment of the present disclosure. Hereinafter, any repetitive detailed description of components already mentioned above will be omitted.

Referring to FIG. 13, the memory system 1000' according to an embodiment of the present disclosure may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory. Furthermore, the memory device 1200' may have the structure described above with reference to FIGS. 1A to 11, and may be manufactured by the fabricating method described above with reference to FIGS. 1A to 11. According to an embodiment, the memory device 1200' may include first conductive patterns extending in a first direction, second conductive patterns extending in a second direction which intersects the first direction, first gap-fill layers between the first conductive patterns, second gap-fill layers between the second conductive patterns, a first trench that passes through the second gap-fill layers and that exposes sidewalls of the first conductive patterns which face each other in the first direction, a third gap-fill layer formed in the first trench, and a first protective layer that is formed in the first trench and that is interposed between the first conductive patterns and the third gap-fill layer. Since the structure of the memory device 1200' and the fabricating method thereof are the same as those described above, a detailed description thereof will be omitted.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. The memory system 1000' may be modified such that each memory chip is coupled to a corresponding single channel.

Since the memory system 1000' according to the embodiment of the present disclosure includes the memory device 1200' having increased integration density and improved characteristics, the integration density and characteristics of the memory system 1000' may also be improved. In addition, since the memory device 1200' is formed into a multi-chip package, data storage capacity and driving speed of the memory system 1000' may be further increased.

Figure 14:
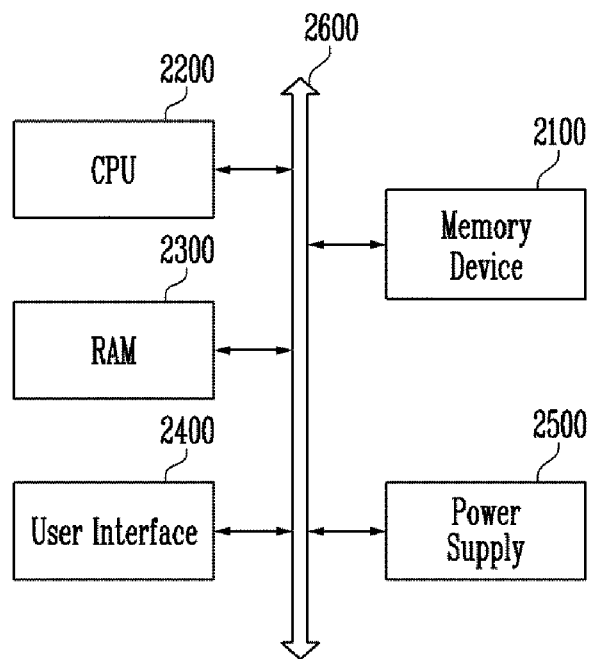
FIGS. 14 and 15 are block diagrams illustrating the configuration of a computing system according to an embodiment of the present disclosure.

FIG. 14 is a block diagram illustrating the configuration of a computing system 2000 according to an embodiment of the present disclosure. Hereinafter, any repetitive detailed description of components already mentioned above will be omitted.

Referring to FIG. 14, the computing system 2000 according to an embodiment of the present disclosure may include a memory device 2100, a CPU 2200, a RAM 2300, a user interface 2400, a power supply 2500, a system bus 2600, and so forth.

The memory device 2100 may store data provided via the user interface 2400, data processed by the CPU 2200, etc. In addition, the memory device 2100 may be electrically coupled to the CPU 2200, the RAM 2300, the user interface 2400, and the power supply 2500 by the system bus 2600. For example, the memory device 2100 may be coupled to the system bus 2600 through a controller (not illustrated), or, alternatively, directly coupled to the system bus 2600. When the memory device 2100 is directly coupled to the system bus 2600, functions of the controller may be performed by the CPU 2200 and the RAM 2300.

The memory device 2100 may be a non-volatile memory. Furthermore, the memory device 2100 may have the structure described above with reference to FIGS. 1A to 11, and may be manufactured by the fabricating method described above with reference to FIGS. 1A to 11. According to an embodiment, the memory device 2100 may include first conductive patterns extending in a first direction, second conductive patterns extending in a second direction which intersects the first direction, first gap-fill layers between the first conductive patterns, second gap-fill layers between the second conductive patterns, a first trench that passes through the second gap-fill layers and that exposes sidewalls of the first conductive patterns which face each other in the first direction, a third gap-fill layer formed in the first trench, and a first protective layer that is formed in the first trench and that is interposed between the first conductive patterns and the third gap-fill layer. Since the structure of the memory device 2100 and the fabricating method thereof are the same as those described above, a detailed description thereof will be omitted.

As described above with reference to FIG. 13, the memory device 2100 may be a multi-chip package configured with a plurality of memory chips.

The computing system 2000 having the above-mentioned configuration may be a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment of the present disclosure includes the memory device 2100 having increased integration density and improved characteristics, the characteristics of the computing system 2000 may also be improved.

Figure 15:
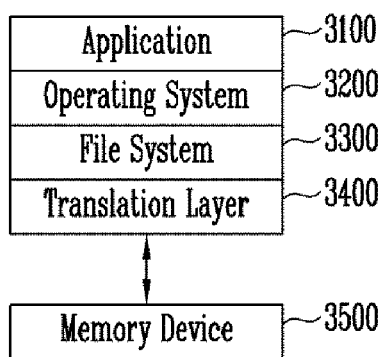

FIG. 15 is a block diagram illustrating a computing system 3000 according to an embodiment of the present disclosure.

Referring to FIG. 15, the computing system 3000 according to an embodiment of the present disclosure may include a software layer which has an operating system 3200, an application 3100, a file system 3300, and a translation layer 3400. Furthermore, the computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a File Allocation Table (FAT), an NT file system (NTFS), or the like. In addition, when the operating system 3200 is a Unix/Linux-based system, the file system 3300 may be an extended file system (EXT), a Unix File System (UFS), a Journaling File System (JFS), or the like.

FIG. 15 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address generated by the file system 3300 into a physical address of the memory device 3500. Mapping information of the logic address and the physical address may be stored in an address translation table. For example, the translation layer 3400 may be a Flash Translation Layer (FTL), a Universal Flash Storage Link Layer (ULL), or the like.

The memory device 3500 may be a non-volatile memory. The memory device 3500 may have a structure consistent with embodiments described above with reference to FIGS. 1A to 11, and may be manufactured by a manufacturing method consistent with embodiments described above with reference to FIGS. 1A to 11. According to an embodiment, the memory device 3500 may include first conductive patterns extending in a first direction, second conductive patterns extending in a second direction which intersects the first direction, first gap-fill layers between the first conductive patterns, second gap-fill layers between the second conductive patterns, a first trench that passes through the second gap-fill layers and that exposes sidewalls of the first conductive patterns which face each other in the first direction, a third gap-fill layer formed in the first trench, and a first protective layer that is formed in the first trench and that is interposed between the first conductive patterns and the third gap-fill layer. Since the structure of the memory device 3500 and the fabricating method thereof are the same as those described above, a detailed description thereof will be omitted.

The computing system 3000 having the above-described configuration may be divided into an operating system layer that is operated in an upper level region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment of the present disclosure includes the memory device 3500 having increased integration density and improved characteristics, characteristics of the computing system 3000 may also be improved.

An electronic device and a method for fabricating the electronic device according to the above-described embodiments of the present disclosure may include a plurality of memory cells with improved operating characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the effective filing date of the present patent document, features, characteristics, and/or elements described in connection with a particular embodiment may be used singly or in combination with features, characteristics, and/or elements described in connection with other embodiments unless otherwise specifically indicated. Accordingly, it will be understood by those skilled in the art that various changes in forms and details may be made without departing from the spirit and scope of the present disclosure as set forth in the following claims.

What is claimed is:

1. An electronic device including a semiconductor memory, the semiconductor memory comprising:
    first conductive patterns extending in a first direction and arranged at intervals in a second direction that intersects the first direction;
    second conductive patterns extending in the second direction and arranged at intervals in the first direction;
    a first gap-fill layer between the first conductive patterns;
    a second gap-fill layer extending to be adjacent to ends of the first conductive patterns and ends of the second conductive patterns;
    a first trench passing through the second gap-fill layer and exposing sidewalls of the first conductive patterns that face the first direction;
    a third gap-fill layer formed in the first trench; and
    a first protective layer formed in the first trench and interposed between the first conductive patterns and the third gap-fill layer,
    wherein the second conductive patterns include an edge conductive pattern adjacent to the first trench, and
    wherein the second gap-fill layer includes a portion interposed between the first protective layer and the edge conductive pattern of the second conductive patterns.

2. The electronic device of claim 1, wherein the first conductive patterns and the third gap-fill layer are separated from each other by the first protective layer.

3. The electronic device of claim 1, wherein the first conductive patterns include a tungsten layer, the third gap-fill layer includes an oxide, and the first protective layer includes a nitride.

4. The electronic device of claim 1, further comprising first liner layers formed on sidewalls of the first conductive patterns that face the second direction.

5. The electronic device of claim 4, wherein the first protective layer is formed on the sidewalls of the first conductive patterns that face the first direction.

6. The electronic device of claim 1, further comprising:
a second trench passing through the second gap-fill layer and exposing sidewalls of the second conductive patterns that face the second direction;
a fourth gap-fill layer formed in the second trench; and
a second protective layer formed in the second trench and interposed between the second conductive patterns and the fourth gap-fill layer.

7. The electronic device of claim 6, further comprising a second liner layer formed on sidewalls of the second conductive patterns that face the first direction.

8. The electronic device of claim 7, wherein the second protective layer is formed on the sidewalls of the second conductive patterns that face the second direction.

9. The electronic device of claim 1, further comprising memory cells located at intersections of the first conductive patterns and the second conductive patterns.

10. The electronic device of claim 9, wherein the memory cells include a variable resistance layer.

11. An electronic device including a semiconductor memory, the semiconductor memory comprising:
first conductive patterns extending in a first direction, wherein each of the first conductive patterns has first etched surfaces that face in the first direction;
second conductive patterns extending in a second direction that intersects the first direction, wherein each of the second conductive patterns has second etched surfaces that face in the second direction;
memory cells located at intersections of the first conductive patterns and the second conductive patterns;
a first gap-fill layer between the first conductive patterns;
a second gap-fill layer extending to be adjacent to the first etched surfaces of each of the first conductive patterns and the second etched surfaces of each of the second conductive patterns;
first trenches passing through the second gap-fill layer and exposing the first etched surfaces of each of the first conductive patterns;
third gap-fill layers formed in the first trenches; and
first protective layers formed in the first trenches and interposed between the first conductive patterns and the third gap-fill layers.

12. The electronic device of claim 11, further comprising:
second trenches passing through the second gap-fill layer and exposing the second etched surfaces of each of the second conductive patterns;
fourth gap-fill layers formed in the second trenches; and
second protective layers formed in the second trenches and interposed between the second conductive patterns and the fourth gap-fill layers.

13. The electronic device of claim 11, further comprising first liner layers formed on sidewalls of each of the first conductive patterns that face in the second direction.

14. The electronic device of claim 11, further comprising a second liner layer formed on sidewalls of each of the second conductive patterns that face in the first direction.

15. An electronic device including a semiconductor memory, the semiconductor memory comprising:
first conductive patterns extending in a first direction;
second conductive patterns extending in a second direction that intersects the first direction;
a first gap-fill layer between the first conductive patterns;
a second gap-fill layer extending to be adjacent to ends of the first conductive patterns and ends of the second conductive patterns;
a first trench passing through the second gap-fill layer and exposing sidewalls of the first conductive patterns that face the first direction;
a third gap-fill layer formed in the first trench; and
a first protective layer formed in the first trench and interposed between the first conductive patterns and the third gap-fill layer,
wherein the first trench has an upper portion having a greater width than a lower portion of the first trench, and
wherein the electronic device further comprises a second protective layer formed on an inner wall of the upper portion of the first trench.

* * * * *